(12) United States Patent
Fulford et al.

(10) Patent No.: US 11,626,329 B2
(45) Date of Patent: Apr. 11, 2023

(54) METAL CONNECTIONS AND ROUTING FOR ADVANCED 3D LAYOUT DESIGNS

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 143 days.

(21) Appl. No.: 17/115,122

(22) Filed: Dec. 8, 2020

(65) Prior Publication Data

US 2021/0366787 A1    Nov. 25, 2021

Related U.S. Application Data

(60) Provisional application No. 63/028,618, filed on May 22, 2020.

(51) Int. Cl.
| | |
|---|---|
| *H01L 21/8238* | (2006.01) |
| *H01L 27/092* | (2006.01) |
| *H01L 29/78* | (2006.01) |
| *H01L 29/66* | (2006.01) |
| *H01L 21/768* | (2006.01) |
| *H01L 23/535* | (2006.01) |

(52) U.S. Cl.
CPC ........ *H01L 21/823871* (2013.01); *H01L 21/76805* (2013.01); *H01L 21/76895* (2013.01); *H01L 21/823885* (2013.01); *H01L 23/535* (2013.01); *H01L 27/092* (2013.01); *H01L 29/66666* (2013.01); *H01L 29/7827* (2013.01)

(58) Field of Classification Search
None
See application file for complete search history.

(56) References Cited

U.S. PATENT DOCUMENTS

2007/0075359 A1 *   4/2007   Yoon .................. H01L 29/7827
                                                                257/329

* cited by examiner

*Primary Examiner* — Hsien Ming Lee
(74) *Attorney, Agent, or Firm* — Oblon, McClelland, Maier & Neustadt, L.L.P.

(57) ABSTRACT

A semiconductor device can include a pad layer including at least one pad structure having a core area surrounded by a peripheral area, and a transistor over the core area. The transistor includes a channel structure extending vertically and a gate structure all around a sidewall portion of the channel structure. The channel structure has a source region and a drain region on opposing ends of a vertical channel region. The channel structure is configured to be electrically coupled to the pad structure. The semiconductor device can further include a first vertical interconnect structure that contacts a top surface of the channel structure, a second vertical interconnect structure that contacts the peripheral area and is configured to be coupled to a bottom surface of the channel structure via the pad structure, and a third vertical interconnect structure that is positioned away from the channel structure and contacts the gate structure.

19 Claims, 16 Drawing Sheets

US 11,626,329 B2

METAL CONNECTIONS AND ROUTING FOR ADVANCED 3D LAYOUT DESIGNS

INCORPORATION BY REFERENCE

This present disclosure claims the benefit of U.S. Provisional Application No. 63/028,618, filed on May 22, 2020, the entire content of which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and methods of microfabrication.

According to a first aspect, a semiconductor device is provided. The semiconductor device can include a pad layer including at least one pad structure having a core area and a peripheral area that surrounds the core area. The semiconductor device can also include a transistor over the core area of the pad structure. The transistor includes a channel structure extending in a vertical direction and a gate structure all around a sidewall portion of the channel structure. The channel structure has a vertical channel region and a source region and a drain region on opposing ends of the vertical channel region. The channel structure is configured to be electrically coupled to the pad structure. The semiconductor device can further include a first vertical interconnect structure that contacts a top surface of the channel structure, a second vertical interconnect structure that contacts the peripheral area and is configured to be coupled to a bottom surface of the channel structure via the pad structure, and a third vertical interconnect structure that is positioned away from the channel structure and contacts the gate structure of the transistor.

In some embodiments, the semiconductor device can further include a fourth vertical interconnect structure that contacts the peripheral area of the pad structure or the gate structure of the transistor.

In some embodiments, the channel structure can be positioned in a center of the pad structure or offset from the center of the pad structure.

In some embodiments, the second vertical interconnect structure and the third vertical interconnect structure can be positioned at a same radial location or different radial locations from the channel structure, and the second vertical interconnect structure and the third vertical interconnect structure can be positioned at a same distance or different distances from the channel structure.

In some embodiments, a particular transistor over a particular pad structure can be the same as or different from a neighboring transistor over a neighboring pad structure.

In some embodiments, one or more of the at least one pad structure can be separated from each other by a dielectric.

In some embodiments, the at least one pad structure can include a first pad structure and a second pad structure that is adjacent to and in contact with the first pad structure. The third vertical interconnect structure over the first pad structure and the third vertical interconnect structure over the second pad structure are chemically identical and in contact with each other to integrally form a first common vertical interconnect structure, and the second vertical interconnect structure over the first pad structure and the second vertical interconnect structure over the second pad structure are chemically identical and in contact with each other to integrally form a second common vertical interconnect structure. The first common vertical interconnect structure can contact a first gate structure of a first transistor disposed over the first pad structure and a second gate structure of a second transistor disposed over the second pad structure, and the second common vertical interconnect structure can contact the first pad structure and the second pad structure. Further, the semiconductor device can include a horizontal contact structure that contacts the first pad structure and the second pad structure. The horizontal contact structure is arranged below the first common vertical interconnect structure. The semiconductor device can also include a dielectric that separates the horizontal contact structure from the first common vertical interconnect structure.

According to a second aspect of the disclosure, a method of microfabrication is provided. The method can include forming a pad layer over a substrate. The pad layer includes at least one pad structure having a core area surrounded by a peripheral area. A transistor can be formed over the core area of the pad structure. The transistor includes a channel structure extending in a vertical direction and a gate structure all around a sidewall portion of the channel structure. The channel structure has a vertical channel region and a source region and a drain region on opposing ends of the vertical channel region. The channel structure is configured to be electrically coupled to the pad structure. A first vertical interconnect structure can be formed that contacts a top surface of the channel structure. A second vertical interconnect structure can be formed that contacts the peripheral area of the pad structure and is configured to be coupled to a bottom surface of the channel structure via the pad structure. A third vertical interconnect structure can be formed that is positioned away from the channel structure and contacts the gate structure of the transistor.

In some embodiments, after forming the transistor over the core area of the pad structure, the method can further include depositing an insulating material over the pad layer to fill spaces and cover the transistor. In some embodiments, forming the first vertical interconnect structure can include forming an opening in the insulating material. The opening uncovers the top surface of the channel structure. The opening is filled with a conductive material. In some embodiments, forming the second vertical interconnect structure can include forming an opening in the insulating material. The opening uncovers the peripheral area of the pad structure. The opening is filled with a conductive material. In some embodiments, forming the third vertical interconnect structure can include forming an opening in the insulating material. The opening uncovers the gate structure. The opening is filled with a conductive material.

In some embodiments, prior to depositing the insulating material over the pad layer, the method can further include depositing a first conductive material that surrounds the transistor and contacts the gate structure. The first conductive material is etched based on a mask so that the first conductive material covers a sidewall portion of the transistor and contacts a sidewall portion of the gate structure. Forming the third vertical interconnect structure can further include forming an opening in the insulating material. The opening uncovers the first conductive material. The opening is filled with a second conductive material. The second conductive material is disposed over the first conductive material.

In some embodiments, a fourth vertical interconnect structure can be formed that contacts the peripheral area of the pad structure or the gate structure of the transistor.

According to a third aspect of the disclosure, a method of microfabrication is provided. The method can include forming a pad layer over a substrate. The pad layer includes a first pad structure and a second pad structure that is adjacent to and in contact with the first pad structure. Transistors can be formed over the first and second pad structures. The transistors include a channel structure extending in a vertical direction and a gate structure all around a sidewall portion of the channel structure. The channel structure has a vertical channel region and a source region and a drain region on opposing ends of the vertical channel region. The channel structure is configured to be electrically coupled to a corresponding pad structure that is arranged below the channel structure and extends horizontally beyond a perimeter of the channel structure. A first vertical interconnect structure can be formed that contacts a first top surface of a first channel structure of a first transistor disposed over the first pad structure. A second vertical interconnect structure can be formed that contacts a second top surface of a second channel structure of a second transistor disposed over the second pad structure. A first common vertical interconnect structure can be formed that is configured to be coupled to a first gate structure of the first transistor and a second gate structure of the second transistor. A second common vertical interconnect structure can be formed that contacts the first pad structure and the second pad structure.

In some embodiments, after forming the transistors over the first and second pad structures, the method can further include forming a first horizontal contact structure and a second horizontal contact structure. Both the first horizontal contact structure and the second horizontal contact structure contact the first pad structure and the second pad structure. A dielectric is deposited over a first horizontal contact structure. A first conductive material is deposited over the dielectric to connect the first gate structure and the second gate structure. An insulating material is deposited over the pad layer to fill spaces and cover the transistors.

In some embodiments, forming the first vertical interconnect structure can be accomplished by forming a first opening in the insulating material and filling the first opening with a second conductive material. The first opening uncovers the first top surface of the first channel structure. Forming the second vertical interconnect structure is accomplished by forming a second opening in the insulating material and filling the second opening with a third conductive material. The second opening uncovers the second top surface of the second channel structure. Forming the first common vertical interconnect structure is accomplished by forming a third opening in the insulating material and filling the third opening with a fourth conductive material. The third opening uncovers the first conductive material. Forming the second common vertical interconnect structure is accomplished by forming a fourth opening in the insulating material and filling the fourth opening with a fifth conductive material. The fourth opening uncovers the second horizontal contact structure.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
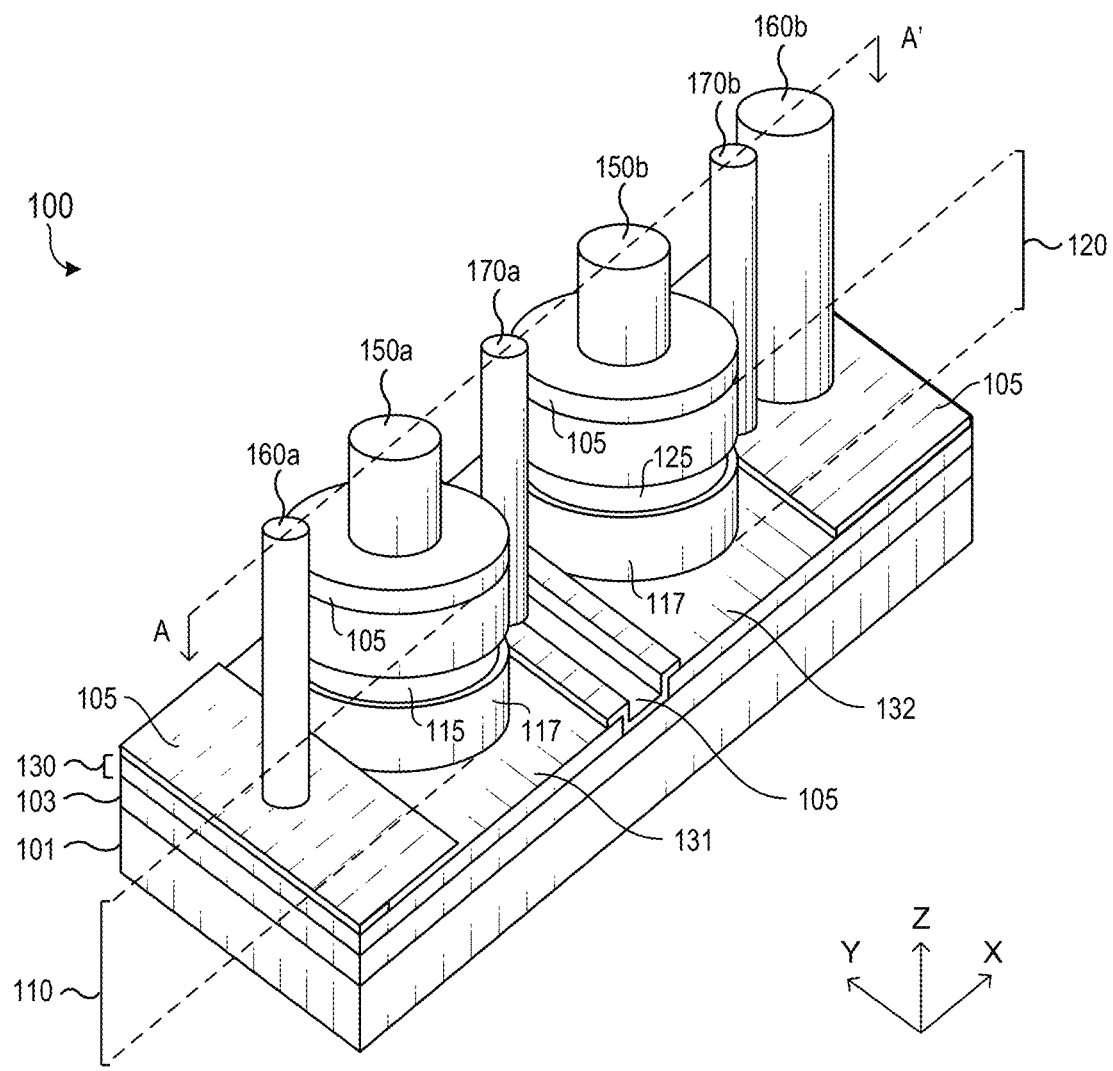
FIG. 1A is a perspective view of a semiconductor device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in Background, 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array), SoC (System on a chip)) is being pursued.

Techniques herein include methods of microfabrication of 3D devices that expand 3D device architectural designs for enhanced performance, and that enable higher density circuits to be produced at reduced cost. Techniques include metal routing methods and designs for vertically oriented and epitaxially grown channels, as well as other vertical transistors.

Methods and designs for such vertical transistors are described in U.S. Ser. No. 63/019,015 filed on 1 May 2020 and titled: "METHOD OF FORMING 3D DEVICES WITH VERTICAL CHANNELS," the contents of which are hereby incorporated by reference in their entirety. Vertical 3D epitaxial growth for vertical transistors allows current flow in a vertical dimension or perpendicular to wafer surface. Methods and designs herein include making CMOS devices with upright current flow. Vertical 3D devices herein enable another degree of freedom in the Z direction that will augment existing 3D devices for layout options. Having relatively short transistor lengths can be achieved because channel length is defined by a deposited layer or an epitaxially grown layer. Precise alignment with gate electrodes is achieved by selective removal of intermediate dielectric layers. Techniques herein eliminate the need for oxide isolation of a 3D nano stack. 360 degree contact connections and layout will be demonstrated for both gate electrode connections and source and drain connections. Because designs herein have 360 degree symmetry with vertical device architecture, the source, drain, and gate electrodes can be placed along any side of the vertical structure for optimum layout efficiency.

Because the gate electrode and source regions herein have 360 degree access, a given contact can be placed at any side of the source and any side of the gate. A relatively short transistor channel length can be achieved by being formed by a deposited layer in contrast to lithographically defined channel lengths. Features include having multiple optional contact locations for vertical channel devices. Benefits include more options to reduce routing congestion and more options for scaling of layout for 3D routing and 3D contacts. Multiple channel lengths within a vertical unified stack are also enabled.

Figure 9:
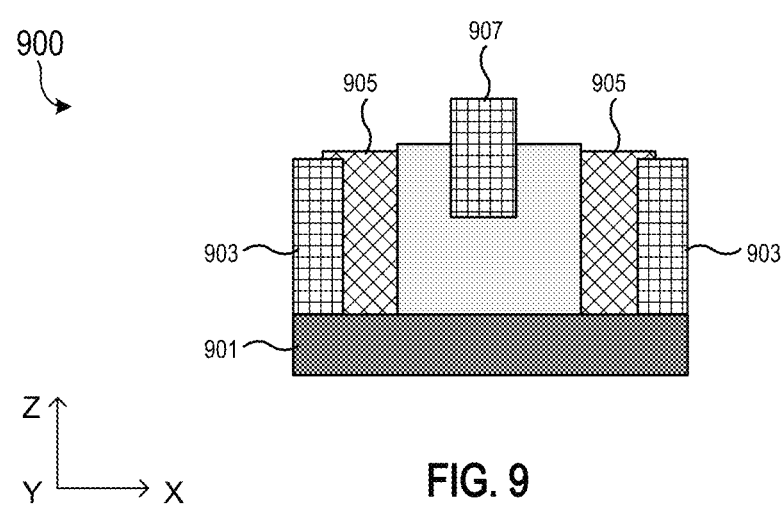
FIG. 9 is a cross-sectional view of a semiconductor device, in accordance with exemplary embodiments of the disclosure.

FIG. 9 is a cross-sectional view of a semiconductor device 900, in accordance with exemplary embodiments of the disclosure. FIG. 9 can illustrate a conventional 3D nanosheet that has current flow in an X direction only (parallel to a working surface of a substrate/wafer) on multiple horizontal planes (i.e., no 360 degree rotational symmetry like a vertical transistor herein). The semiconductor device 900 can include source and region regions 903 over a substrate 901. The semiconductor device 900 can also include a gate structure 907 and nanosheets 905 over the substrate 901. Transistors herein with vertical channels having current flowing in a vertical direction have many access points to source, drain, and gate regions.

FIG. 1A is a perspective view of a semiconductor device 100, in accordance with exemplary embodiments of the disclosure. The semiconductor device 100 can include a substrate 101 and a pad layer 130 over the substrate 101. In some embodiments, the substrate 101 and the pad layer 130 can be separated by a first dielectric layer 103. The pad layer 130 can include at least one pad structure, such as a first pad structure 131 and a second pad structure 132 in this example. In some embodiments, one or more of the pad structures can be connected with corresponding neighboring pad structures. In other embodiments, one or more of the pad structures can be separated from corresponding neighboring pad structures. In this example, the first pad structure 131 and the second pad structure 132 are separated from each other by a second dielectric 105. The second dielectric 105 can also be disposed on portions of the first pad structure 131 and the second pad structure 132. In some embodiments, the second dielectric 105 can be disposed to fully cover uncovered portions of the first pad structure 131 and the second pad structure 132. Further, the semiconductor device 100 can include transistors (e.g., 110 and 120) and vertical interconnect structures (e.g., 150a, 150b, 160a, 160b, 170a, and 170b) disposed over the pad structures (e.g., 131 and 132). While shown to be cylindrical in this example, the transistors (e.g., 110 and 120) and the vertical interconnect structures (e.g., 150a, 150b, 160a, 160b, 170a, and 170b) can also have other shapes.

Figure 1B:
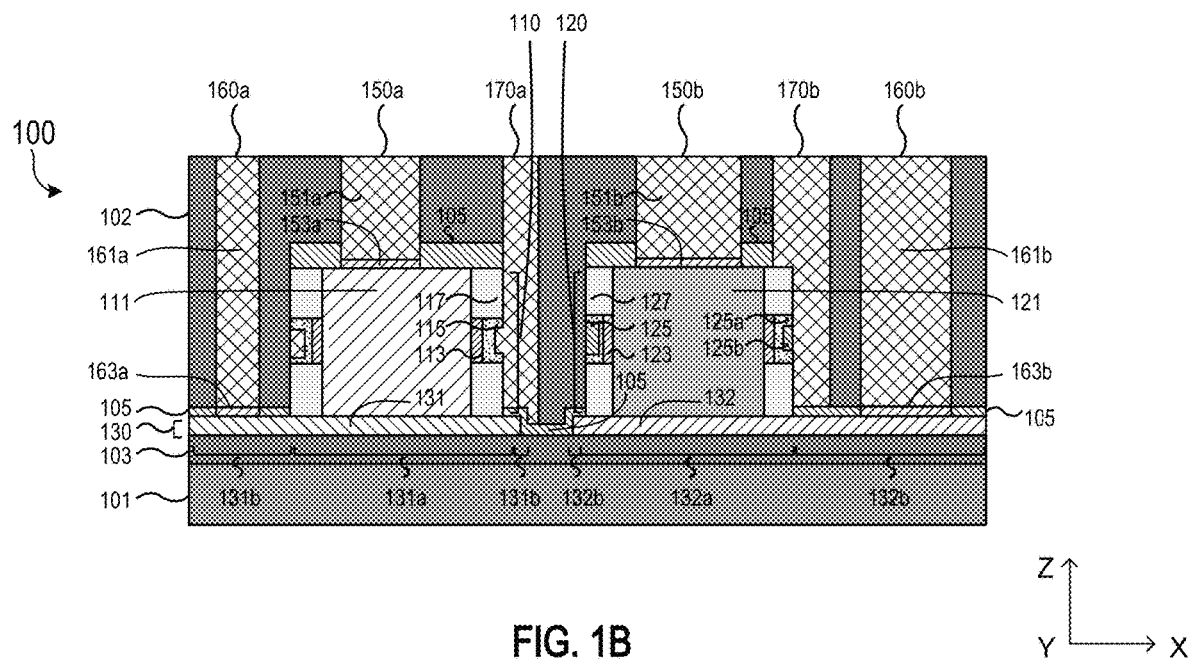
FIG. 1B is a cross-sectional view taken along the line cut AA' in FIG. 1A, in accordance with exemplary embodiments of the disclosure.

FIG. 1B is a cross-sectional view taken along the line cut AA' in FIG. 1A, in accordance with exemplary embodiments of the disclosure. As shown, the pad structures can have core areas surrounded by peripheral areas. In this example, the first pad structure 131 includes a first core area 131a surrounded by a first peripheral area 131b, and the second pad structure 132 includes a second core area 132a surrounded by a second peripheral area 132b. In some embodiments, a particular core area may be positioned on an edge of a corresponding pad structure.

Further, the semiconductor device 100 can include transistors disposed over the core areas of the pad structures. Consequently, the pad structures can extend horizontally beyond perimeters of corresponding transistors. As shown, a first transistor 110 and a second transistor 120 are disposed over the first core area 131a and the second core area 132a, respectively. In this example, the first transistor 110 and the second transistor 120 are NMOS and PMOS, respectively. Accordingly, the first pad structure 131 and the second pad structure 132 can include n-type silicon and p-type germanium, respectively. As illustrated, the first transistor 110 can include a first channel structure 111 (e.g., n-type silicon) extending in a vertical direction (or in a Z direction) and a first gate structure 115 (e.g., TiN and TaN) all around a sidewall portion of the first channel structure 111. A first high-k dielectric 113 (e.g., $HfO_2$, $ZrO_2$, $TiO_2$, $La_2O_3$, and $Y_2O_3$) can be sandwiched between the first channel structure 111 and the first gate structure 115. The first transistor 110 can further include a first spacer material 117 that isolates the first gate structure 115.

Similarly, the second transistor 120 can include a second channel structure 121 (e.g., p-type germanium), a second gate structure 125, a second high-k dielectric 123 (e.g., $HfO_2$, $ZrO_2$, $TiO_2$, $La_2O_3$, and $Y_2O_3$), and a second spacer material 127. The second gate structure 125 can have a first portion 125a (e.g., TiN and TaN) and a second portion (e.g., TiAl). The first spacer material 117 and the second spacer material 127 can include any electrical insulator, and in this example includes a same material, such as silicon nitride. Similarly, the first high-k dielectric 113 and the second high-k dielectric 123 can be made of a same high-k dielectric.

Further, while not shown, the channel structures (e.g., 111 and 121) can include a vertical channel region and a source region and a drain region on opposing ends (e.g., top and bottom) of the vertical channel region. The vertical channel region, the source region, and the drain region can include a same semiconductor material, but may have different dopants and/or different dopant concentrations. Since positions of the source region and the drain region are interchangeable, a source or drain region will be noted as an S/D region. Accordingly, a top S/D region and a bottom S/D region are disposed over and below the vertical channel region, respectively. During operation, current can flow in the Z direction, for example, from the top S/D region to the bottom S/D region via the vertical channel region.

Still referring to FIG. 1B, an insulating material 102 (e.g., silicon oxide) that is disposed over the pad layer 130 can fill spaces and cover the transistors (e.g., 110 and 120). The semiconductor device 100 can include first vertical interconnect structures (e.g., 150a and 150b) that extend through the insulating material 102 and contacts top surfaces of the channel structures (e.g., 111 and 121). As a result, the first vertical interconnect structures 150a and 150b are configured to be coupled to a top S/D region of the first transistor 110 and a top S/D region of the second transistor 120, respectively. The semiconductor device 100 can also include second vertical interconnect structures (e.g., 160a and 160b) that extend through the insulating material 102, contact the peripheral areas (e.g., 131b and 132b), and are configured to be coupled to bottom surfaces of the channel structures (e.g., 111 and 121) via the pad structures (e.g., 131 and 132). Hence, the second vertical interconnect structures 160a and 160b are configured to be coupled to a bottom S/D region of the first transistor 110 and a bottom S/D region of the second transistor 120, respectively. The semiconductor device 100 can further include third vertical interconnect structures (e.g., 170a and 170b) that are positioned away from the channel structures (e.g., 111 and 121) and contact the gate structures (e.g., 115 and 125). Consequently, the third vertical interconnect structures 170a and 170b can function as a first gate electrode and a second gate electrode, respectively.

As illustrated in FIG. 1B, the first and second vertical interconnect structures can include metal portions (e.g., 151a, 151b, 161a, and 161b) over bottom portions (e.g., 153a, 153b, 163a, and 163b). In this example, the metal portions 151a, 151b, 161a, and 161b and the third vertical interconnect structures 170a and 170b are made of a same metal material, such as tungsten, and can be formed by chemical vapor deposition (CVD). The bottom portions 153a and 163a are made of a same salicide, such as nickel silicide. The bottom portions 153b and 163b are made of a same material, such as nickel germanide. In some embodiments, the metal portions 151a, 151b, 161a, and 161b can include other conductive materials. In some embodiments, the bottom portions 153a, 153b, 163a, and 163b can include other metal-silicon compounds or other metal-germanium compounds, and typical metals can include Ru, Ti, Co, W, Pt, Pd, and the like. In some embodiments, the metal portions 151a, 151b, 161a, and 161b and the third vertical interconnect structures 170a and 170b may include different conductive materials from one another. In some embodiments, the bottom portions 153a, 153b, 163a, and 163b may include different materials from one another. In some embodiments, the third vertical interconnect structures 170a and 170b may include bottom portions and top portions (not shown). Further, while the third vertical interconnect structures 170a and 170b are separated from the pad structures 131 and 132 by the second dielectric 105 in this example, the third vertical interconnect structures 170a and 170b may be further separated from the second dielectric 105 by the insulating material 102 in other embodiments (not shown).

It should be noted that while the first transistor 110 and the second transistor 120 are NMOS and PMOS in this example, respectively, the first transistor 110 and the second transistor 120 can include any kind of transistor to meet specific design requirements. In one embodiment, the first transistor 110 and the second transistor 120 are PMOS and NMOS, respectively. In another embodiment, the first transistor 110 and the second transistor 120 are both PMOS. In another embodiment, the first transistor 110 and the second transistor 120 are both NMOS.

Figure 1C:
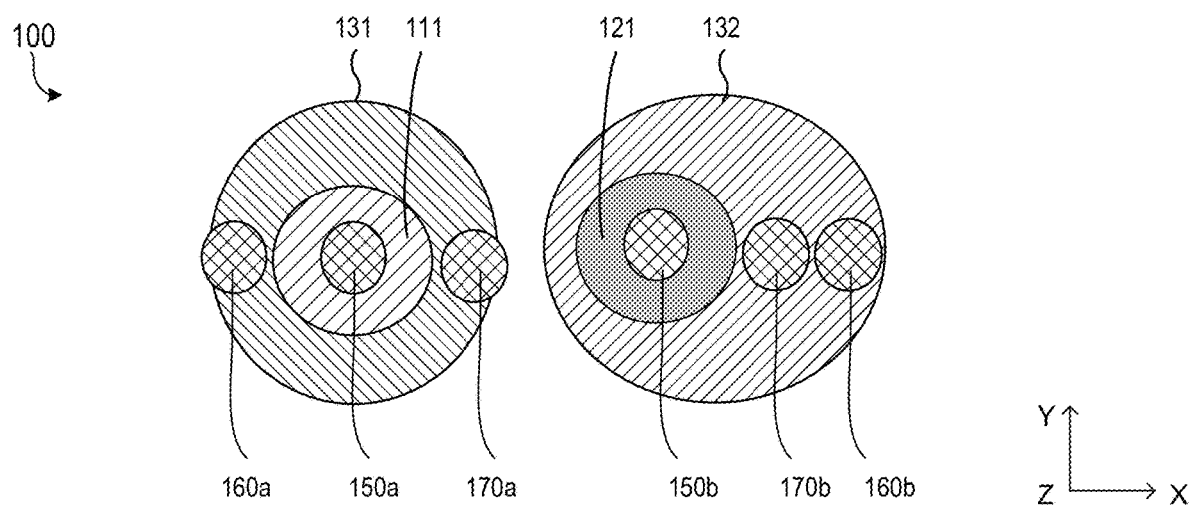
FIG. 1C is a top-down schematic of the semiconductor device in FIG. 1A, in accordance with exemplary embodiments of the disclosure.

FIG. 1C is a top-down schematic of the semiconductor device in FIG. 1A, in accordance with exemplary embodiments of the disclosure. In this example, the second vertical interconnect structure 160a and the third vertical interconnect structure 170a are disposed on different sides of the first channel structure 111 and at a same distance from the first channel structure 111. The second vertical interconnect structure 160b and the third vertical interconnect structure 170*b* are disposed on a same side of the second channel structure 121 and at different distances from the second channel structure 121. It should be understood that positions, including radial locations and distances, of the vertical interconnect structures (e.g., 150*a*, 150*b*, 160*a*, 160*b*, 170*a*, and 170*c*) relative to corresponding channel structures (e.g., 111 and 121) can be varied, based on a wiring routing design.

Figure 2A:
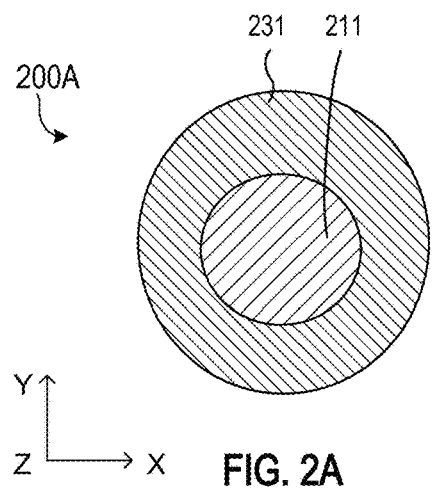
FIGS. 2A, 2B, 2C, 2D, and 2E show layout design examples, in accordance with some embodiments.
Figure 2B:
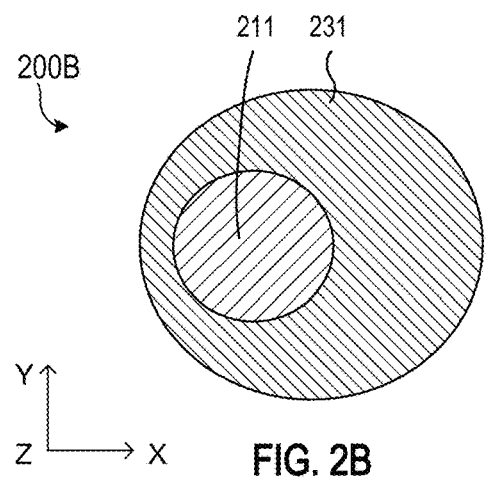

FIGS. 2A-2E show layout design examples (Layout 200A, Layout 200B, Layout 200C, Layout 200D, and Layout 200E), in accordance with some embodiments. Particularly, FIGS. 2A and 2B are top views showing positions of channel structures relative to pad structures. Note that a given channel structure can be centered on a corresponding pad structure or offset in any direction. For example, in Layout 200A, a channel structure 211 is centered on a pad structure 213 while the channel structure 211 is offset from a center of the pad structure 213 in Layout 200B.

Figure 2C:
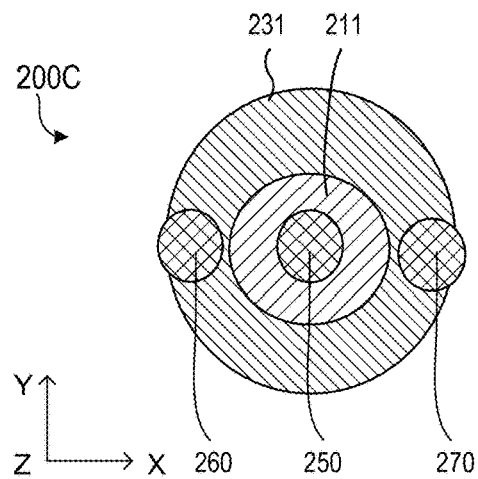
Figure 2D:
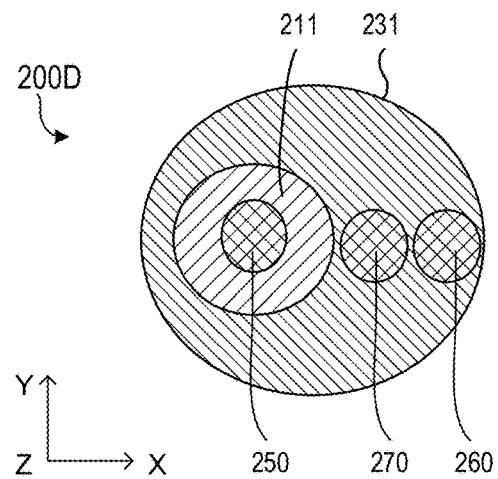
Figure 2E:
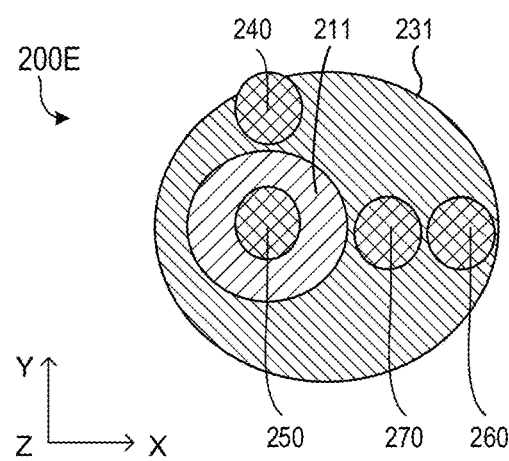

FIGS. 2C-2E are top views showing exemplary vertical interconnect structure placement. In Layout 200C, the channel structure 211 is centered on the pad structure 231. A first vertical interconnect structure 250 is disposed over the pad structure 213 and can function as a top S/D contact. A second vertical interconnect structure 260 that can function as a bottom S/D contact and a third vertical interconnect structure 270 that can function as a gate electrode are on different sides of the channel structure 211. Further, the first, second, and third vertical interconnect structures 250, 260, and 270 are in line with each other. Note that the first transistor 110 in FIGS. 1A-1C can correspond to Layout 200C.

In Layout 200D, the channel structure 211 is offset from the center of the pad structure 231 (or the pad structure 231 extends more to a right side of the channel structure 211 in the X direction). The second vertical interconnect structure 260 and the third vertical interconnect structure 270 are on a same side of the channel structure 211. Further, the second vertical interconnect structure 260 and the third vertical interconnect structure 270 can be positioned at a same radial location relative to the channel structure 211, but at a different distance. In this example, the third vertical interconnect structure 270 is positioned at a perimeter location of the channel structure 211, while the second vertical interconnect structure 260 is positioned farther from the channel structure 211. Note that the second transistor 120 in FIGS. 1A-1C can correspond to Layout 200D.

Layout 200E is similar to Layout 200D, except that a fourth vertical interconnect structure 240 can be disposed on a back side of the channel structure 211. The fourth vertical interconnect structure 240 can contact a gate structure (not shown) and function as a gate electrode, similar to the third vertical interconnect structure 270. Alternatively, the fourth vertical interconnect structure 240 can contact a peripheral area of the pad structure 231 and function as a bottom S/D contact, similar to the second vertical interconnect structure 260.

Note that the channel structure 211, the pad structure 231, and the first, second, and third vertical interconnect structures 250, 260, and 270 can correspond to the channel structures 111 and 121, the pad structures 131 and 132, and the vertical interconnect structures 150*a*-150*b*, 160*a*-160*b*, and 170*a*-170*b*, respectively. The descriptions have been provided above and will be omitted here for simplicity purposes. Further, while the first, second, and third vertical interconnect structures 250, 260, and 270 are shown to be in line with each other in FIGS. 2C-2E, the radial locations of the second and third vertical interconnect structures 260 and 270 relative to the channel structure 211 may vary, which will be explained in detail in FIGS. 3A-3D.

FIGS. 3A-3D show layout design examples (Layout 300A, Layout 300B, Layout 300C, and Layout 300D), in accordance with some embodiments. Both a circular and rectangular 3D vertical devices are shown. Vertical channels of either shape can be considered to have a circumference or perimeter, around which contacts can be placed at any radial location and at any distance. Of course, the 3D vertical devices can also have other shapes.

In Layout 300A, a first vertical interconnect structure 350 can be formed over a channel structure 311 in the Z direction. A second vertical interconnect structure 360 and a third vertical interconnect structure 370 can be separated from the channel structure 311 in the XY plane by an isolation layer 304 and arranged along a perimeter of the isolation layer 304. In this example, the second vertical interconnect structure 360 and the third vertical interconnect structure 370 are in line with the first vertical interconnect structure 350. Therefore, Layout 300A can correspond to the first transistor 110 in FIGS. 1A-1C and Layout 200C in FIG. 2C. In other embodiments, the second vertical interconnect structure 360 and the third vertical interconnect structure 370 can be located in any positions away from the channel structure 311. Accordingly, the vertical interconnect structures 350, 360, and 370 may not necessarily be in line with one another. Note that the channel structure 311, the vertical interconnect structures 350, 360, and 370 can correspond to the channel structures 111 and 121 and the vertical interconnect structures 150*a*-150*b*, 160*a*-160*b*, and 170*a*-170*b*, respectively. In some embodiments, the isolation layer 304 can correspond to the insulating material 102. In other embodiments, the isolation layer 304 may further include the first spacer material 117 or the second spacer material 127.

Figure 3A:
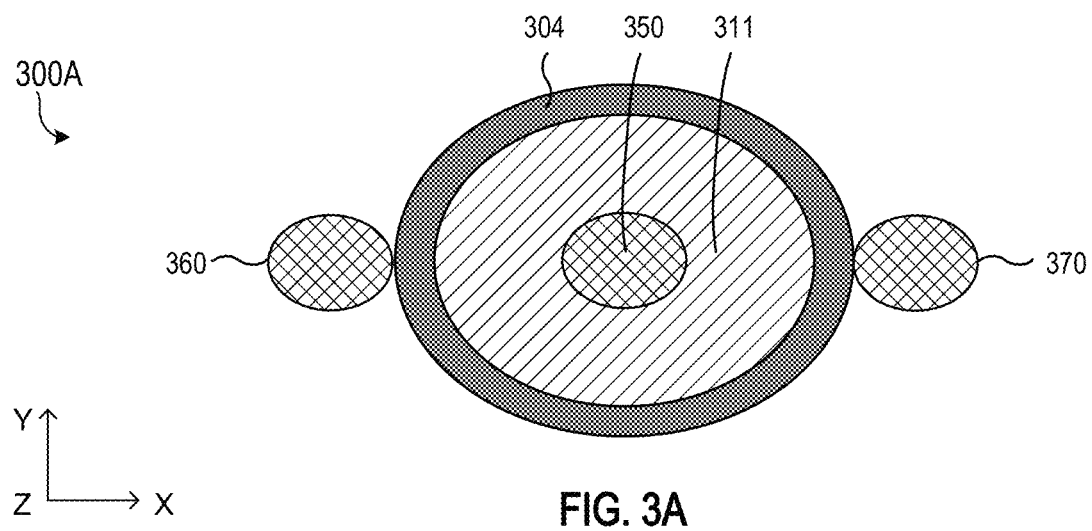
FIGS. 3A, 3B, 3C, and 3D show layout design examples, in accordance with some embodiments.
Figure 3B:
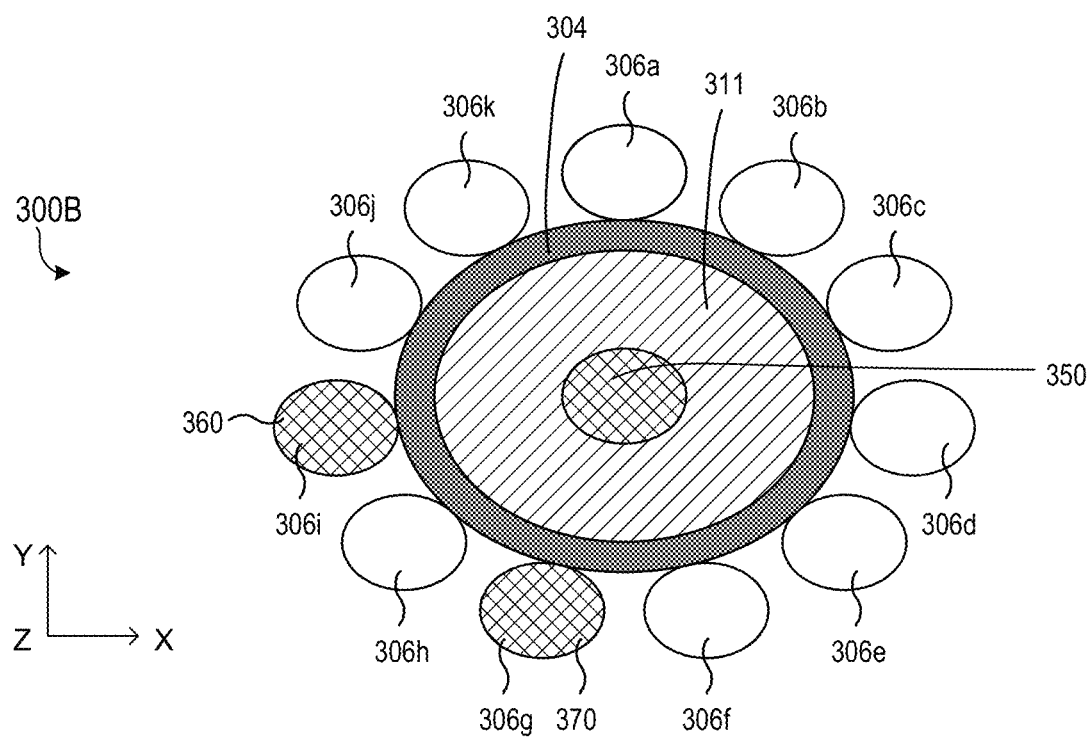
Figure 3C:
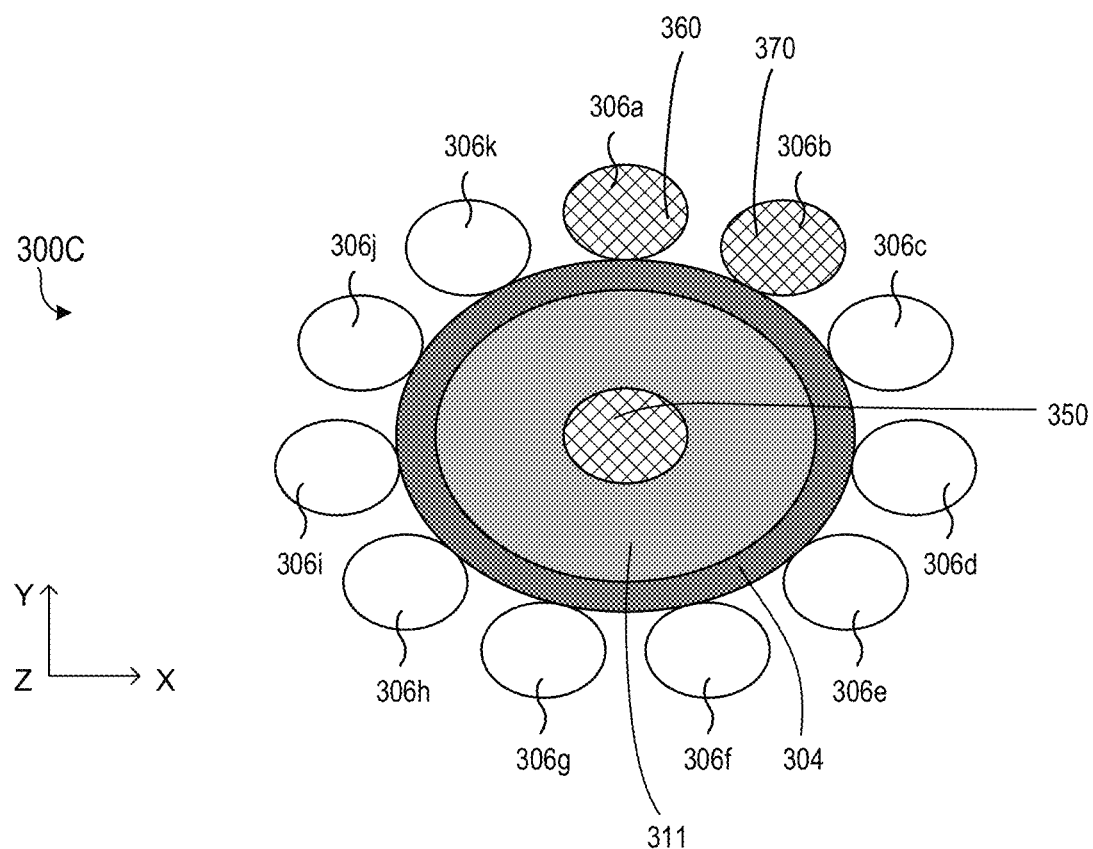

FIG. 3B illustrates a top view of an example of 360 degree connection options with a vertical transistor. Vertical connection sizes can control a number of optional locations. In this example, there are twelve (different potential) contact locations 306*a*-306*k* relative to the channel structure 311 for 3D vertical devices. During manufacturing, two of the contact locations 306*a*-306*k* can be selectively used for forming the second and third vertical interconnect structures 360 and 370 that can function as a bottom S/D contact and a gate electrode, respectively. Note that Layout 300B is similar to Layout 300A, except that there are ten unused contact locations 306*a*-306*f*, 306*h*, and 306*j*-306*k*. In other words, only the contact locations 306*g* and 306*i* will go through corresponding etching and deposition processes to form contacts or interconnects during manufacturing. Also note that because there is 360 degree symmetry with this vertical device architecture, the second and third vertical interconnect structures 360 and 370 can be placed along any side of the vertical structure for optimum layout efficiency.

Figure 3D:
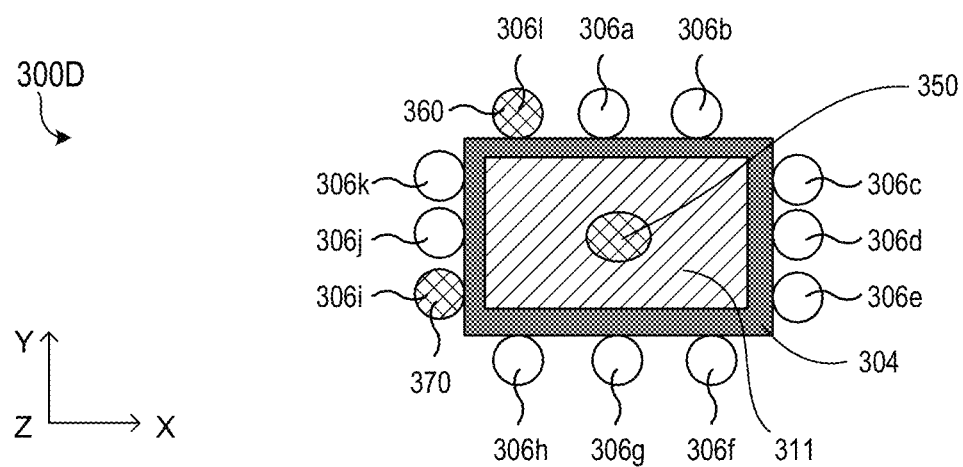

In some embodiments, two neighboring contact locations of the photomask may be used. For example, in Layout 300C in FIG. 3C, the second and third vertical interconnect structures 360 and 370 are formed in the contact locations 306*a* and 306*b*. It should be understood that the contact locations 306*a* and 306*b* are separated from each other by one or more electrical insulators. In some embodiments, the channel structure 311 may have a different shape. For example, Layout 300D shown in FIG. 3D is similar to Layouts 300B and 300C, except that the channel structure 311 is rectangular and that there are thirteen contact locations 306*a*-306*l*. The contact locations 306*i* and 306*l* are used in this example. Further, sizes, shapes, radial positions relative to the channel structure 311, distances from the channel structure 311, and the number of contact locations can vary in other embodiments.

Figure 4:
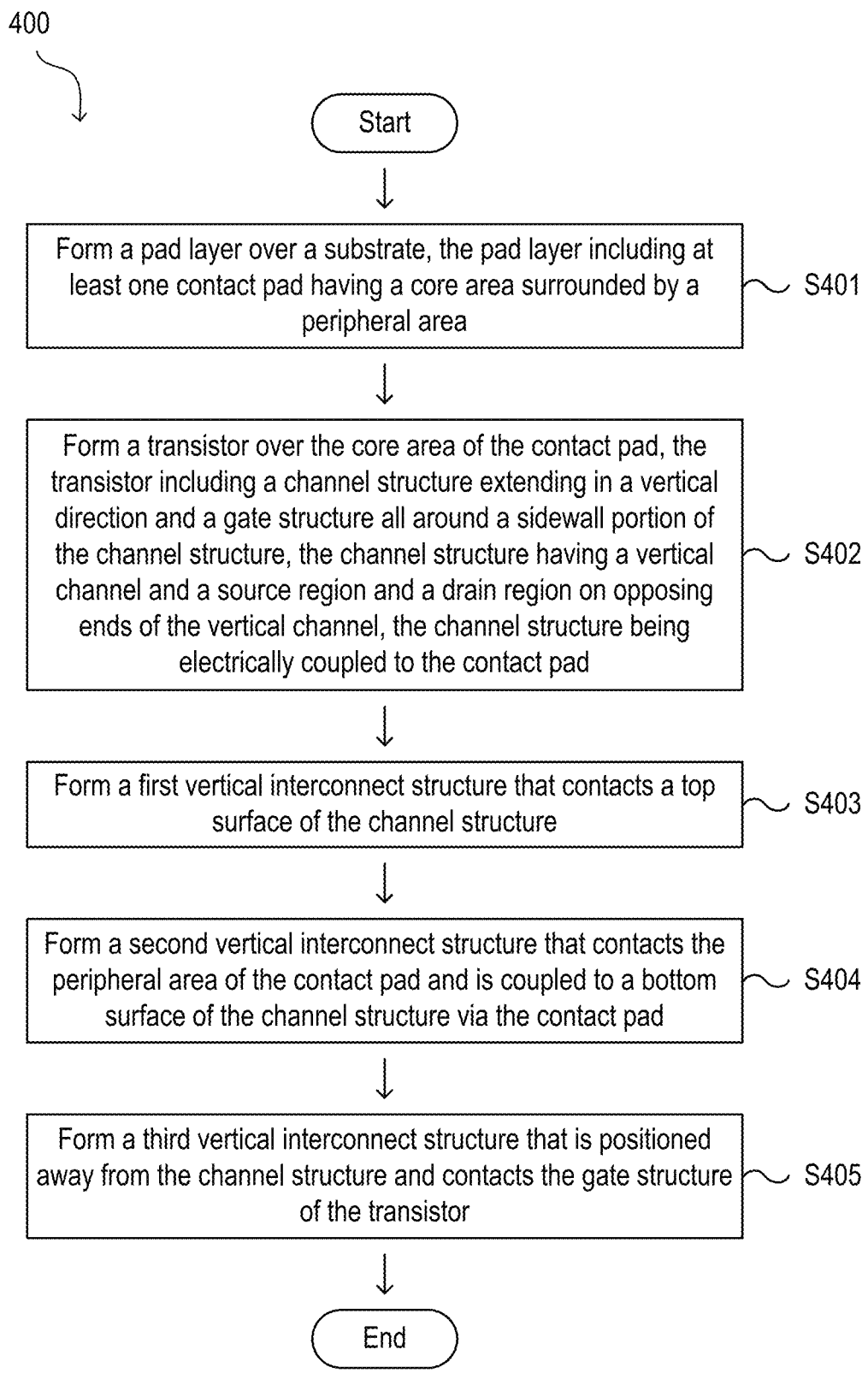
FIG. 4 shows a flowchart of an exemplary process for manufacturing an exemplary semiconductor device, in accordance with embodiments of the disclosure.

FIG. 4 shows a flowchart of an exemplary process 400 for manufacturing an exemplary semiconductor device, in accordance with embodiments of the disclosure. The process 400 begins with step S401 where a pad layer is formed over a substrate. The pad layer can include at least one pad structure having a core area surrounded by a peripheral area. For example, the pad layer can include a first pad structure and a second pad structure. In some embodiments, the first pad structure and the second pad structure can be separated from each other by a dielectric. In alternative embodiments, the first pad structure and the second pad structure can be connected to each other.

At step S402, a transistor can be formed over the core area of the pad structure. The transistor can include a channel structure extending in a vertical direction and a gate structure all around a sidewall portion of the channel structure. The channel structure can have a vertical channel region and a source region and a drain region on opposing ends of the vertical channel region. The channel structure is configured to be electrically coupled to the pad structure. In some embodiments, a PMOS device and a NMOS device can be formed on two adjacent pad structures. In some embodiments, two PMOS devices or two NMOS devices can be formed on two adjacent pad structures.

At step S403, a first vertical interconnect structure can be formed that contacts a top surface of the channel structure. In some embodiments, the first vertical interconnect structure is configured to be electrically coupled to a top source region or a top drain region of the transistor.

At step S404, a second vertical interconnect structure can be formed that contacts the peripheral area of the pad structure and is configured to be coupled to a bottom surface of the channel structure via the pad structure. In some embodiments, the second vertical interconnect structure is configured to be electrically coupled to a bottom source region or a bottom drain region of the transistor.

At step S405, a third vertical interconnect structure can be formed that is positioned away from the channel structure and contacts the gate structure of the transistor. In some embodiments, the third vertical interconnect structure functions as a gate electrode of the transistor.

It should be noted that additional steps can be provided before, during, and after the process 400, and some of the steps described can be replaced, eliminated, or performed in a different order for additional embodiments of the process 400. For example, an insulating material can be deposited over the pad layer to fill spaces and cover the transistor, prior to step S403. In some embodiments, step S403 may be performed before or after step S404. In other embodiments, step S403 and step S404 may be performed together. That is, the first and second vertical interconnect structures may be formed in a same process. Further, step S405 can be executed during intermediate steps of step S403 and step S404 in some embodiments.

FIGS. 5A-5H are cross-sectional views of a semiconductor device 500, at various intermediate steps of a manufacturing process, in accordance with exemplary embodiments of the disclosure. Particularly, FIGS. 5A-5H can illustrate 360 degree VIA (vertical interconnect access) formation on a CMOS GAA vertical transistor by making via gate contacts (or bottom portions of gate electrodes) first, followed by source and drain contacts, with salicidation after contact opening. This example uses a CMOS flow, but an NMOS only or a PMOS only flow can be substituted in other embodiments.

Figure 5A:
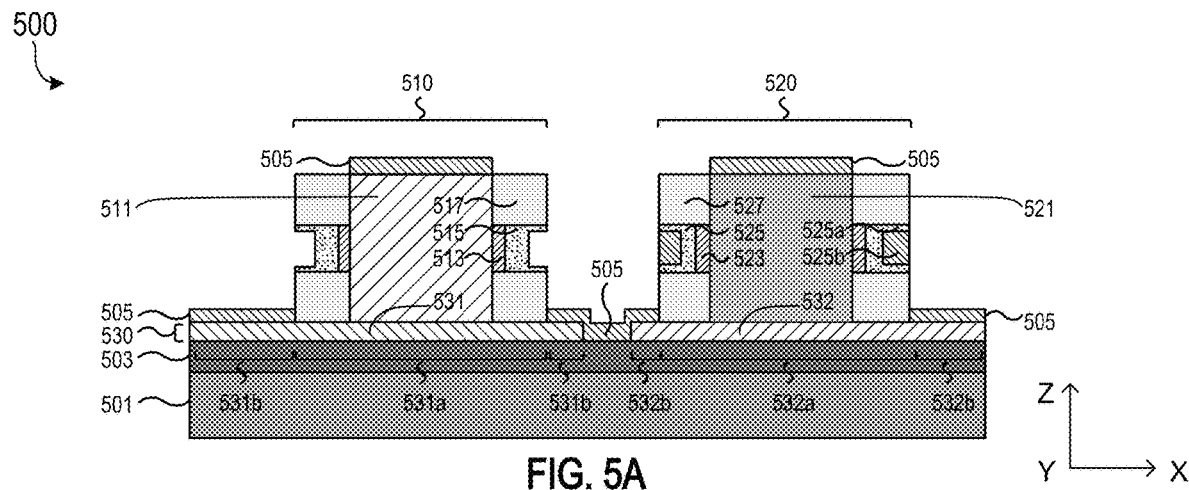
FIGS. 5A, 5B, 5C, 5D, 5E, 5F, 5G, 5G', and 5H are cross-sectional views of a semiconductor device at various intermediate steps of manufacturing, in accordance with exemplary embodiments of the disclosure.

As shown in FIG. 5A, the semiconductor device 500 includes a substrate 501 and a pad layer 530 over the substrate 501. The substrate 501 and the pad layer 530 can be separated by a first dielectric layer 503. The pad layer 530 can include at least one pad structure, such as a first pad structure 531 and a second pad structure 532. In this example, the first pad structure 531 and the second pad structure 532 are separated by a second dielectric 505.

The first pad structure 531 and can have a first core area 531a that is surrounded by a first peripheral area 531b, and the second pad structure 532 and can have a second core area 532a that is surrounded by a second peripheral area 532b. A first transistor 510 and a second transistor 520 can be disposed over the first core area 531a and the second core area 532a, respectively. The first transistor 510 can have a first channel structure 511 and a first gate structure 515 all around a sidewall portion of the first channel structure 511. The first transistor 510 can also include a first high-k dielectric 513 that is sandwiched between the first channel structure 511 and the first gate structure 515, and a first spacer material 517 that isolates the first channel structure 511. Similarly, the second transistor 520 can have a second channel structure 521, a second gate structure 525, a second high-k dielectric 523, and a second spacer material 527. In this example, the first transistor 510 and the second transistor 520 are NMOS and PMOS, respectively. Accordingly, the second gate structure 525 can include a first portion 525a and a second portion 525b. In addition, portions of the first and second peripheral areas 531b and 532b and the first and second channel structures 511 and 521 can be covered by the second dielectric 505.

Note that the substrate 501, the first dielectric layer 503, the pad layer 530 (including the first pad structure 531 and the second pad structure 532) and the second dielectric 505 can correspond to the substrate 101, the first dielectric layer 103, the pad layer 130 (including the first pad structure 131 and the second pad structure 132) and the second dielectric 105, respectively. The first transistor 510 and the second transistor 520 can correspond to the first transistor 110 and the second transistor 120, respectively. Accordingly, the channel structures 511 and 521, the gate structures 515 and 525, the high-k dielectrics 513 and 525, and the spacer materials 517 and 527 can correspond to the channel structures 111 and 121, the gate structures 115 and 125, the high-k dielectrics 113 and 125, and the spacer materials 117 and 127, respectively.

Further, in FIG. 5A, each of the channel structures 511 and 521 can have a length defined by a deposition process, such as epitaxial growth. Conventional techniques for defining a channel length function by depositing a film and then using photolithography to cut a film or fin into a channel or fin segment. With techniques herein, a channel location is defined, and then the length or distance of current transmission path can be defined by epitaxial growth, atomic layer deposition, or another precisely controlled deposition technique. Note that the channel structures 511 and 521 can be resting on a silicon or germanium material which can have P or N implanted dopants. In this example, NMOS is isolated from and arranged side by side with PMOS. In other examples, the pad structures (e.g., 531 and 532) can be connected. These pad structures can function as an S/D connection landing spot and thus extend beyond footprints or perimeters of the channel structures (e.g., 511 and 521).

Figure 5B:
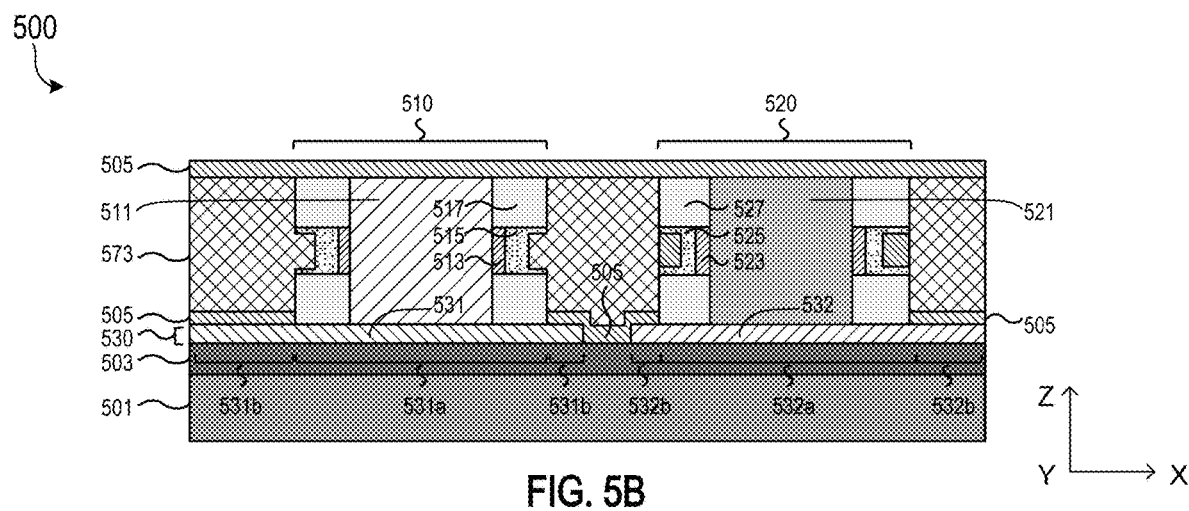

In FIG. 5B, a conductive material 573 can be deposited over the pad layer 530 to fill spaces, and the second dielectric 505 can be deposited over the conductive material 573. For example, the conductive material 573 can include a metal such as tungsten (W). Accordingly, deposition of tungsten can be executed by CVD, followed by a planarization step (e.g., CMP) to remove W overburden, and then the second dielectric 505 is deposited thereon. Note that the second dielectric 505 and the first dielectric 503 can be a same material or be different dielectric materials that can be selectively etched relative to each other.

Figure 5C:
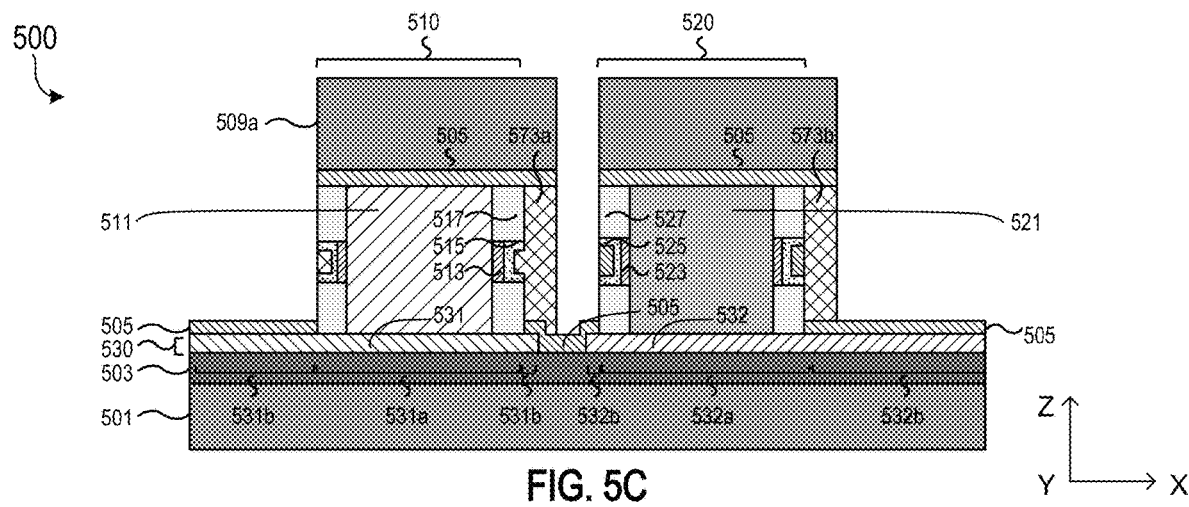
Figure 5D:
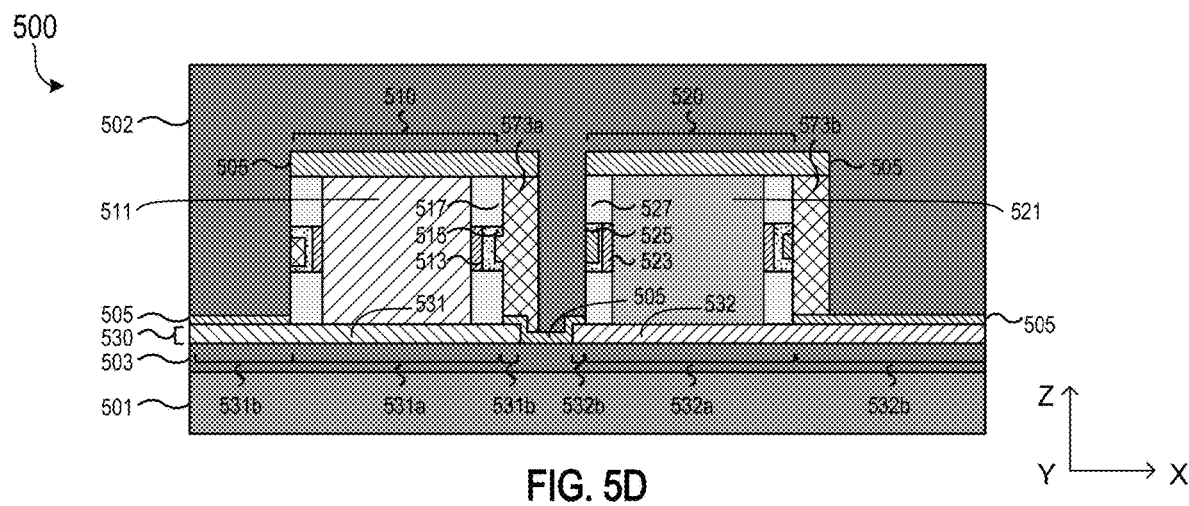

In FIG. 5C, a first etch mask 509a is used to etch and define future metal gate connection. As a result, bottom portions of third vertical interconnect structures 573a and 573b can be formed that are connected to sidewall portions of the first and second channel structures 511 and 521, respectively. The first etch mask 509a can be made of a photoresist or hardmask material. In FIG. 5D, the first etch mask 509a is removed, followed by dielectric deposition and planarization. Consequently, an insulating material 502 that fills spaces and covers the transistors 510 and 520 is formed over the pad layer 530.

Figure 5E:
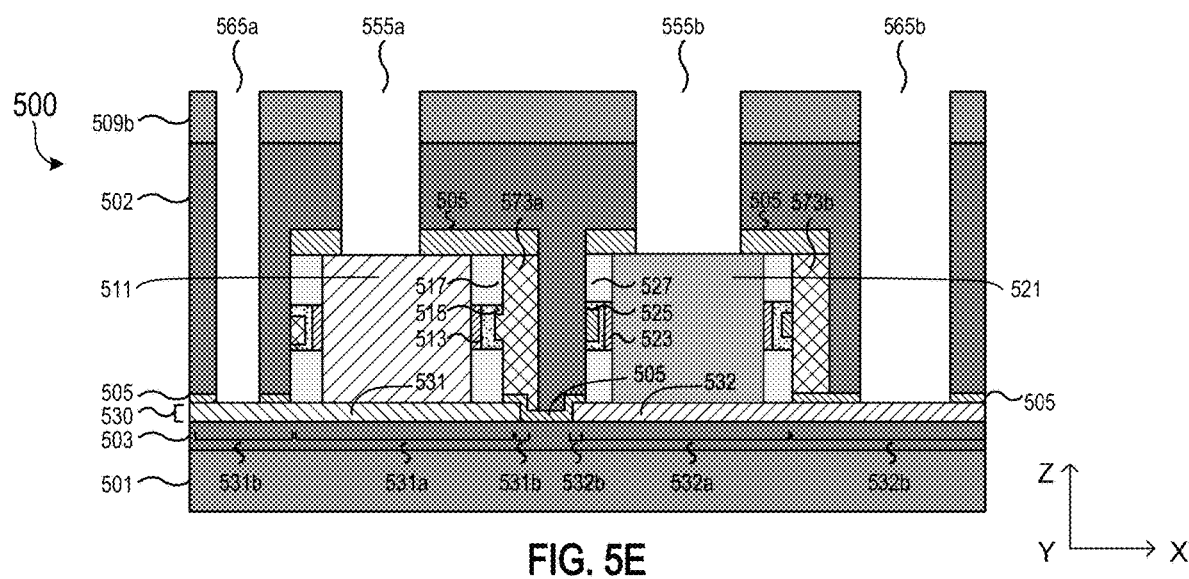

In FIG. 5E, a second etch mask 509b is used to define S/D regions or form contact openings to S/D regions. As shown, first openings 555a and 555b extend through the insulating material 502 and the second dielectric 505, and land on top surfaces of the first and second channel structures 511 and 521, respectively. Second openings 565a and 565b extend through the insulating material 502 and the second dielectric 505, and then land on top surfaces of the first and second peripheral areas 531b and 532b, respectively. Note that the pad structures 531 and 532 are in contact with the channel structures 511 and 521 and extend beyond circumferences or perimeters of the channel structures 511 and 521, respectively. The pad structures 531 and 532 can extend in all directions (or some directions) beyond the channel structures 511 and 521, respectively, to provide available connection points at any radial location and at any distance from a center point of the channel structures 511 and 521. In addition, while the first openings 555a and 555b and the second openings 565a and 565b are formed in a same step in this example, the first openings 555a and 555b and the second openings 565a and 565b can be formed in separate steps in other embodiments.

Figure 5F:
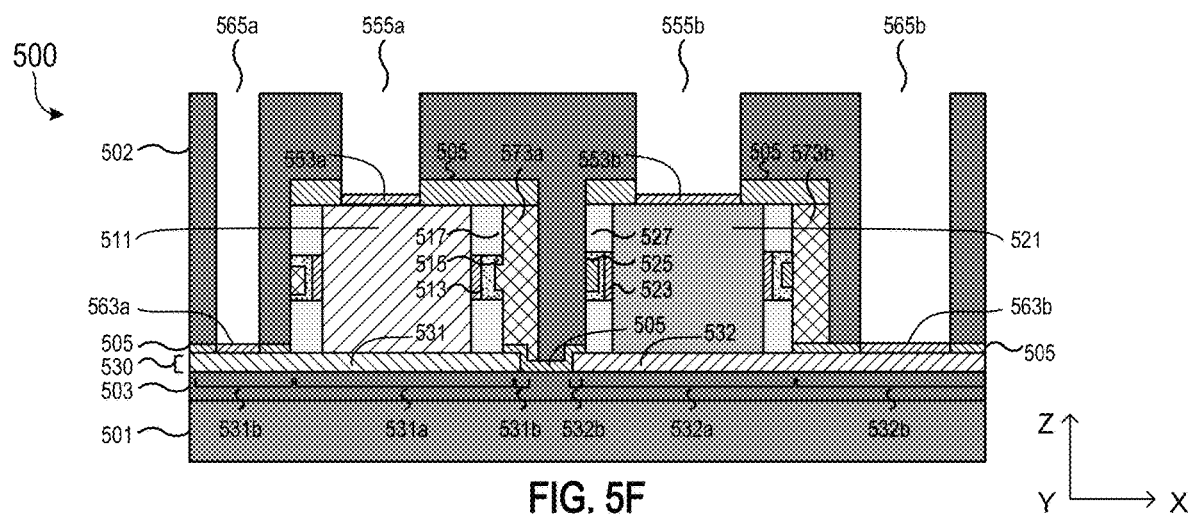

In FIG. 5F, the second mask 509b is removed, and then a metal material (not shown) is deposited at bottoms of the first openings 555a and 555b on uncovered portions of the first and second channel structures 511 and 521 and at bottoms of the second openings 565a and 565b on uncovered portions of the first and second peripheral areas 531b and 532b, followed by salicidation to form bottom portions 553a, 553b, 563a, and 563b. The salicidation can, for example, be accomplished by annealing to react the metal material with the pad structures 531 and 532 to make a salicide layer, and any unreacted metal material can be removed. In this example, the metal material is Ni. The bottom portions 553a, 553b, 563a, and 563b can include nickel silicide and/or nickel germanide, depending on chemical compositions of the first and second pad structures 531 and 532. Other metals, such as Ru, Ti, Co, W, Pt, Pd, et cetera, can also be used for forming the bottom portions 553a, 553b, 563a, and 563b. The bottom portions 553a, 553b, 563a, and 563b can be made of a same material or different materials, depending on the chemical compositions of the first and second pad structures 531 and 532. Further, thicknesses of the bottom portions 553a, 553b, 563a, and 563b can be controlled by metal deposition and salicidation.

Figure 5G:
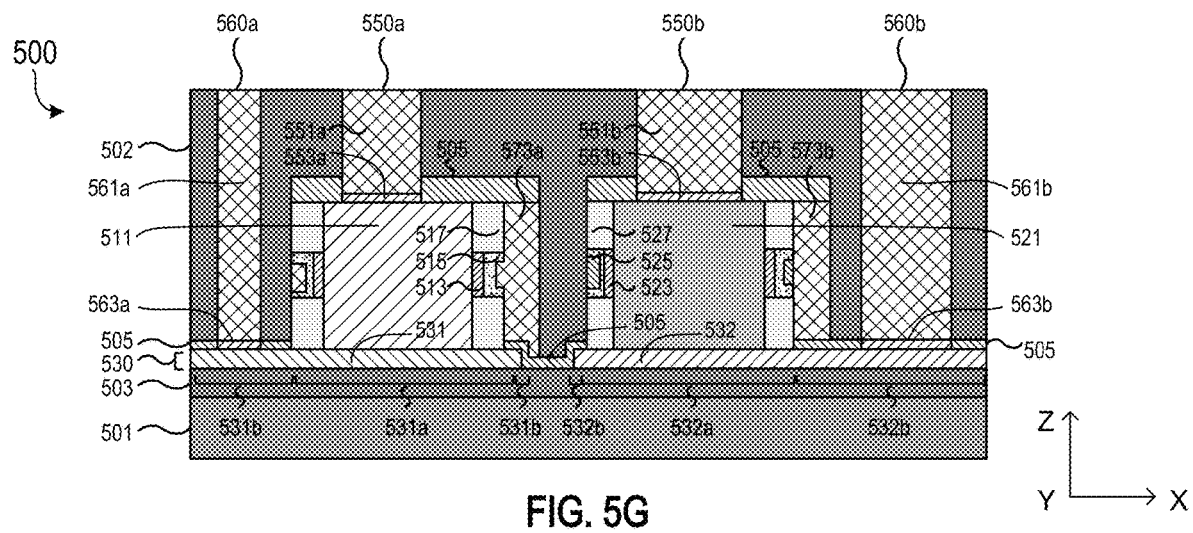
Figure 5G:
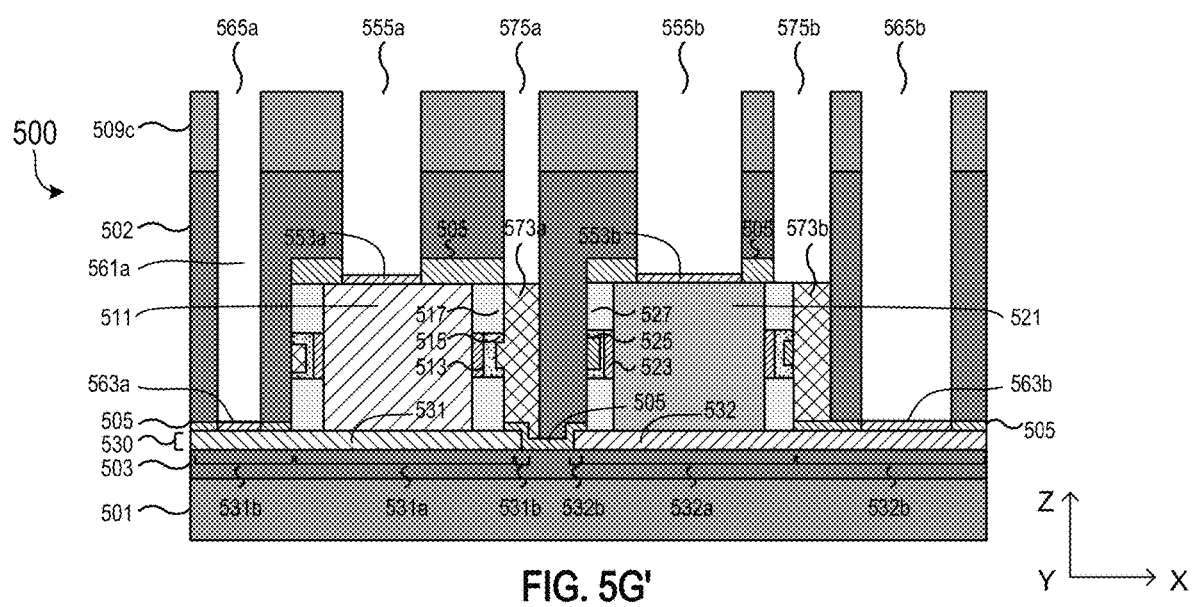

In some embodiments, the manufacturing process then proceeds to FIG. 5G, where metal portions 551a, 551b, 561a, and 561b are formed so that first vertical interconnect structures 550a and 550b and second vertical interconnect structures 560a and 560b are completed. For example, a deposition of W (such as by CVD) can be executed, followed by removal of overburden. Note that the first vertical interconnect structures 550a and 550b and the second vertical interconnect structures 560a and 560b can correspond to the first vertical interconnect structures 150a and 150b and the second vertical interconnect structures 160a and 160b, respectively.

Subsequently, in FIG. 5H, third vertical interconnect structures 570a and 570b are completed so that the semiconductor device 500 can correspond to the semiconductor device 100 in FIGS. 1A-1C. In order to complete the third vertical interconnect structures 570a and 570b, a third etch mask (not shown) is formed to create third openings (not shown) that uncover the bottom portions of the third vertical interconnect structures 573a and 537b, and then top portions of the third vertical interconnect structures (not shown) can be formed thereon by depositing the conductive material 573 to fill the third openings. In other embodiments, the top portions of the third vertical interconnect structures may be chemically different from the bottom portions of the third vertical interconnect structures 573a and 573b. Additionally, the third vertical interconnect structures 573a and 537b can be located at any radial location around perimeters of the channel structures 511 and 521.

In alternative embodiments, after salicidation in FIG. 5F, the manufacturing process proceeds to FIG. 5G' where the aforementioned third openings 575a and 575b are formed before formation of the first and second vertical interconnect structures 550a, 550b, 560a, and 560b. First, the insulating material 502 can be deposited to fill the first openings 555a and 555b and the second openings 565a and 565b (not shown). Then, a fourth etch mask 509c is formed that redefines the first and second openings 555a, 555b, 565a, and 565b and defines the third openings 575a and 575b that uncover the bottom portions of the third vertical interconnect structures 573a and 573b. In some embodiments, the first openings 555a and 555b and the second openings 565a and 565b may not need to be filled and redefined, and the third openings 575a and 575b can be formed directly with a different fourth etch mask 509c.

Subsequently, in FIG. 5H, a metal deposition is executed to fill the first, second, and third openings 555a, 555b, 565a, 565b, 575a, and 575b, followed by CMP planarization to remove overburden. As a result, the semiconductor device 500 can correspond to the semiconductor device 100 in FIGS. 1A-1C.

Figure 6A:
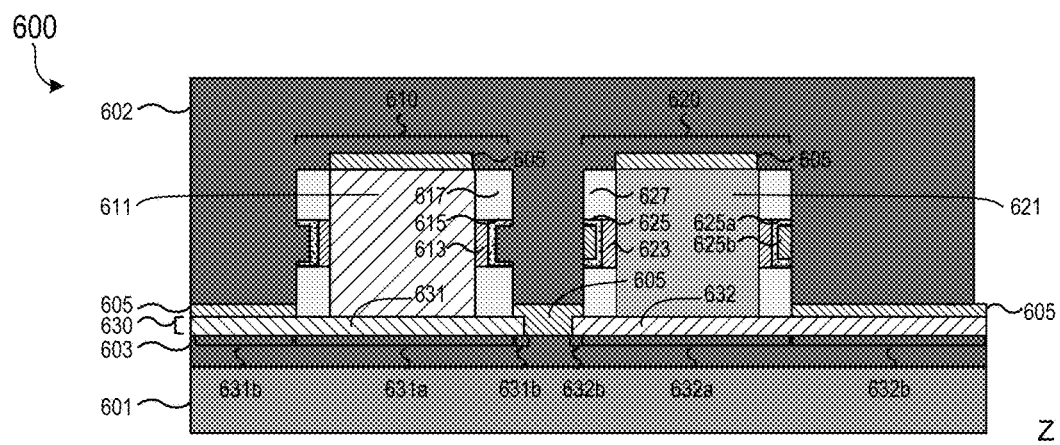
FIGS. 6A, 6B, and 6C are cross-sectional views of a semiconductor device, at various intermediate steps of manufacturing, in accordance with exemplary embodiments of the disclosure.
Figure 6B:
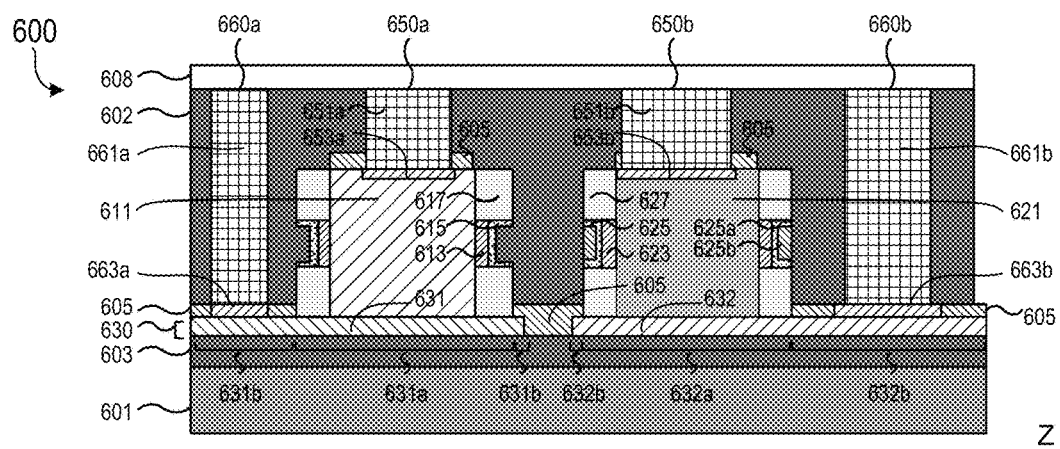
Figure 6C:
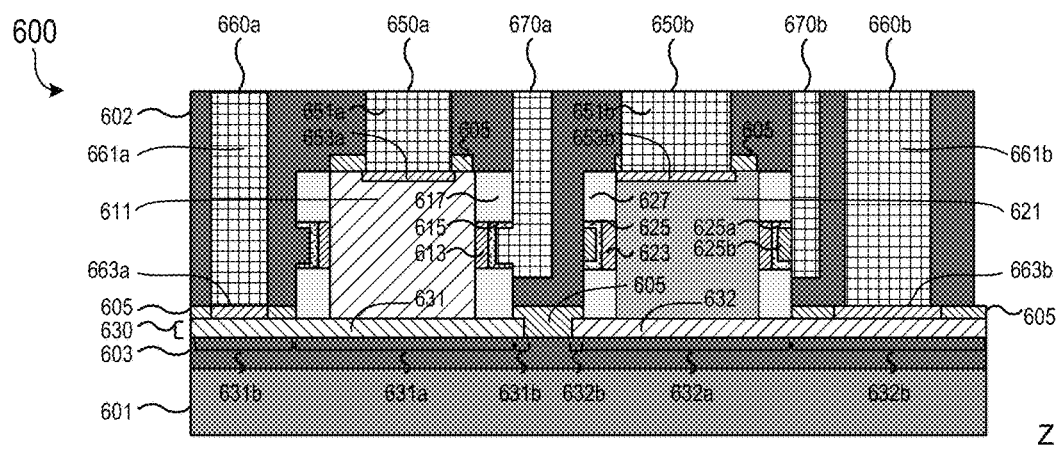

FIGS. 6A-6C are cross-sectional views of a semiconductor device 600, at various intermediate steps of an alternative manufacturing process, in accordance with exemplary embodiments of the disclosure. Particularly, FIGS. 6A-6C can illustrate an alternative embodiment that provides 360 degree via formation on a CMOS GAA vertical transistor, making source and drain contacts (salicidation after S/D contact opening), followed by via contacts for gate electrode regions. Illustrations show a CMOS device, but techniques herein can also be applied to side-by-side PMOS devices and side-by-side NMOS devices.

Since the example embodiment of the semiconductor device 600 in FIG. 6A is similar to the example embodiment of the semiconductor device 500 in FIG. 5A, explanation will be given with emphasis placed upon differences. The semiconductor device 600 can include an insulating material 602 over a pad layer 630. The insulating material 602 can fill spaces and cover a first transistor 610 and a second transistor 620.

Figure 5H:
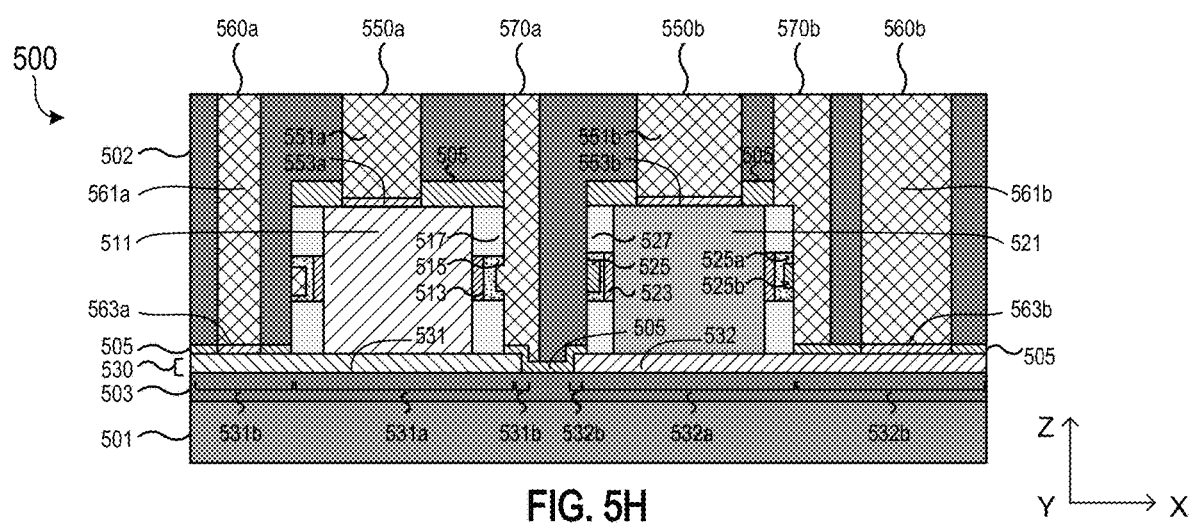

In FIG. 6B, first vertical interconnect structures 650a and 650b and second vertical interconnect structures 660a and 660b can be formed that correspond to the first vertical interconnect structures 550a and 550b and second vertical interconnect structures 560a and 560b in FIG. 5H, respectively. Formation of the first vertical interconnect structures 650a and 650b and the second vertical interconnect structures 660a and 660b can be accomplished in a process that is similar to what is demonstrated in FIGS. 5E-5G. Specifically, a mask (not shown) can be formed that defines first and second openings (not shown) for the vertical interconnect structures 650a, 650b, 660a, and 660b. Then, bottom portions 653a, 653b, 663a, and 663b can be formed by metal deposition and salicidation. Next, metal portions 651a, 651b, 661a, and 661b can be formed. Further, an etch stop layer 608 (e.g., silicon nitride) can be optionally deposited over the insulating material 602 and the vertical interconnect structures 650a, 650b, 660a, and 660b.

In FIG. 6C, third vertical interconnect structures 670a and 670b are formed. As a result, the semiconductor device 600 can correspond to the semiconductor device 500 in FIG. 5H. In this embodiment, a gate electrode opening is formed with a separate mask (not shown), with which a directional etch is executed, followed by mask removal and metal fill. A subsequent CMP process can be executed that stops on the insulating material 602 by using the etch stop layer 608 to determine an endpoint of the CMP process. Note that the directional etch may include etching a portion of the insulating material 602 that is adjacent to a first gate 615 so as to uncover the first gate 615. Further, the third vertical interconnect structures 670a and 670b can correspond to the third vertical interconnect structures 570a and 570b in FIG. 5H, respectively, except that the third vertical interconnect structures 670a and 670b can be formed in single etch and deposition process while the third vertical interconnect structures 570a and 570b can be formed in two etch and deposition processes. In addition, the third vertical interconnect structures 670a and 670b can be separated from a second dielectric 605 by the insulating material 602.

While not shown, in some embodiments, the first and second openings can be formed in the insulating material 602 in FIG. 6A, followed by salicidation to form the bottom portions 653a, 653b, 663a, and 663b. Then, the third openings can be formed, followed by metal deposition to fill the first, second, and third openings so that the semiconductor device 600 in FIG. 6H is formed.

Figure 7A:
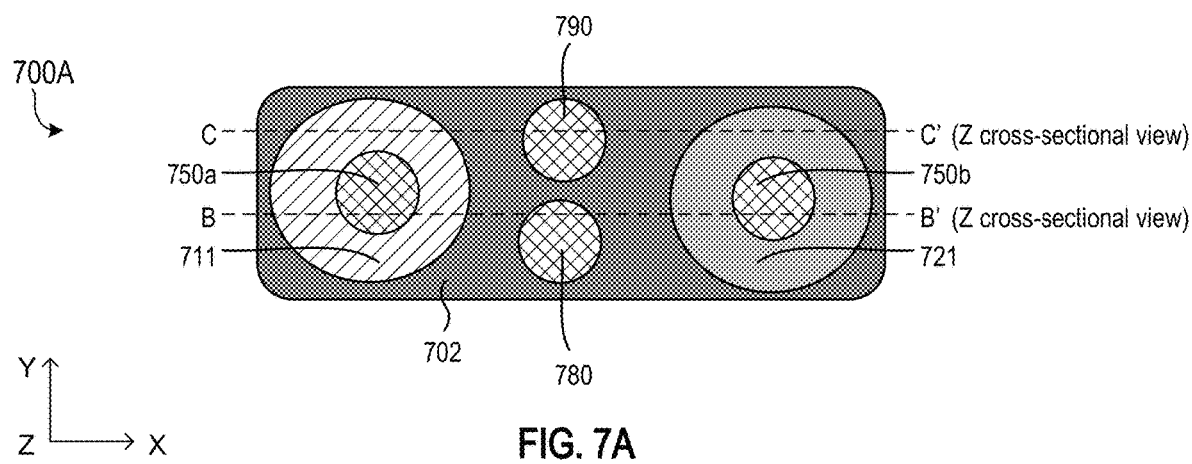
FIG. 7A is a top-down schematic of a semiconductor device, in accordance with exemplary embodiments of the disclosure.

FIG. 7A is a top-down schematic of a semiconductor device 700A, in accordance with exemplary embodiments of the disclosure. As shown, the semiconductor device 700A can include first vertical interconnect structures 750a and 750b disposed over a first channel structure 711 and a second channel structure 721, respectively. The semiconductor device 700A can also include a first common vertical interconnect structure 780 and a second common vertical interconnect structure 790. An insulating material 702 can fill spaces and separate the first common vertical interconnect structure 780 from the second common vertical interconnect structure 790. While not shown, a plurality of the semiconductor device 700A can be formed in an array.

Figure 7B:
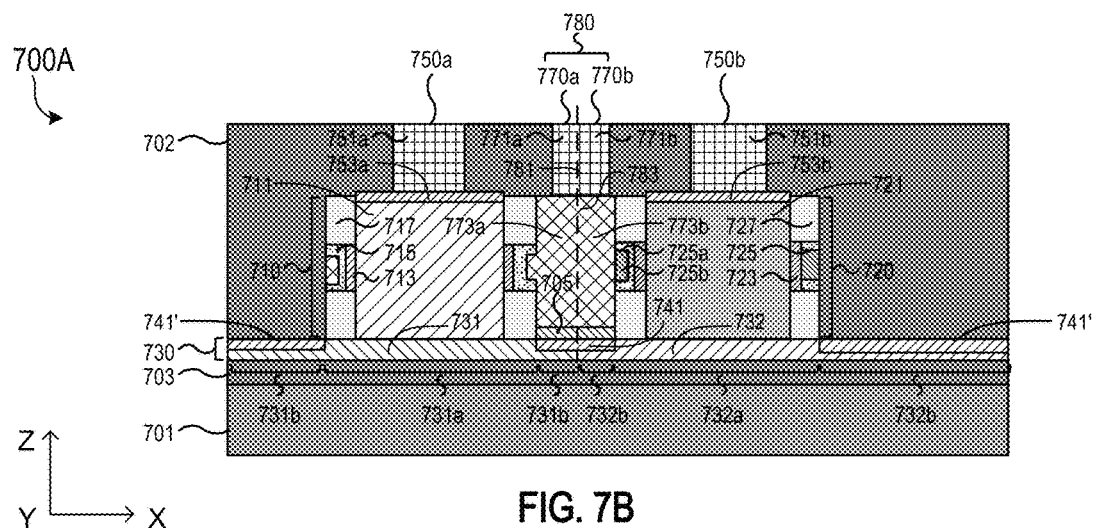
FIGS. 7B and 7C are cross-sectional views taken along the line cuts BB' and CC' in FIG. 7A, respectively, in accordance with exemplary embodiments of the disclosure.

FIG. 7B shows a cross-sectional view taken along the line cut BB' in the Z direction in FIG. 7A. Since the example embodiment of the semiconductor device 700A in FIG. 7B is similar to the example embodiment of the semiconductor device 600 in FIG. 6C, explanation will be given with emphasis placed upon differences. In this example, second vertical interconnect structures (will be shown and explained in FIG. 7C) and third vertical interconnect structures 770a and 770b are arranged at different radial locations. Particularly, the third vertical interconnect structures 770a and 770b are adjacent to and in contact with each other. Further, the third vertical interconnect structures 770a and 770b can be chemically identical and thus integrally form the first common vertical interconnect structure 780. In this example, the third vertical interconnect structures 770a and 770b can include top portions 771a and 771b and bottom portions 773a and 773b. The top portions 771a and 771b can be chemically identical and integrally form a top portion of the first common vertical interconnect structure 781. The bottom portions 773a and 773b can be chemically identical and integrally form a bottom portion of the first common vertical interconnect structure 783 that is connected to a first gate structure 715 and a second gate structure 725. As a result, the first common vertical interconnect structure 780 can function as a common gate electrode for a first transistor 710 and a second transistor 720. In this example, the top and bottom portions of the first common vertical interconnect structure 781 and 783 are made of different materials. Alternatively, the top and bottom portions of the first common vertical interconnect structure 781 and 783 can be made of a same material, such as tungsten.

Further, in FIG. 7B, a first pad structure 731 and a second pad structure 732 are in contact with each other. A first horizontal contact structure 741 can be disposed that contacts both the first pad structure 731 and the second pad structure 732. The first horizontal contact structure 741 can reduce resistance between the first pad structure 731 and the second pad structure 732. The first horizontal contact structure 741 can be arranged in recesses of the first pad structure 731 and the second pad structure 732 as shown in this example or over the first pad structure 731 and the second pad structure 732 in other embodiments. A second dielectric 705 can be disposed over the first horizontal contact structure 741 to separate the first horizontal contact structure 741 from the first common vertical interconnect structure 780. In this example, the first horizontal contact structure 741 is a salicide, such as nickel silicide, and horizontal structures 741' that are made of a same salicide can be disposed over peripheral areas 731b and 732b.

Figure 7C:
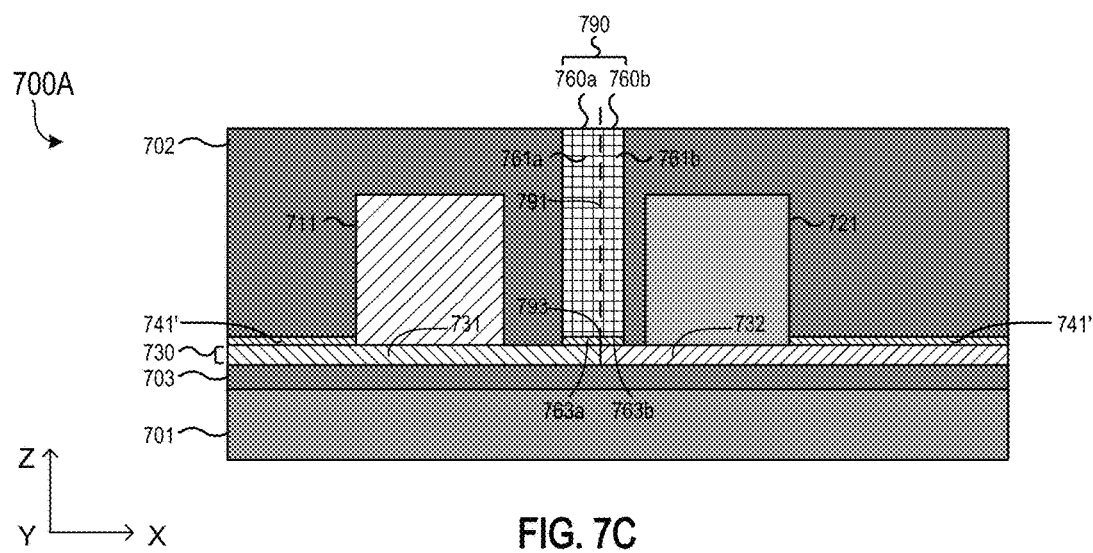

FIG. 7C is a cross-sectional view taken along the line cut CC' in the Z direction in FIG. 7A. Second vertical interconnect structures 760a and 760b are adjacent to and in contact with each other. Further, the second vertical interconnect structures 760a and 760b can be chemically identical and thus integrally form the second common vertical interconnect structure 790. That is, the second vertical interconnect structures 760a and 760b can include metal portions 761a and 761b and bottom portions 763a and 763b. The metal portions 761a and 761b can be chemically identical and integrally form a metal portion of the second common vertical interconnect structure 791. The bottom portions 763a and 763b can be chemically identical and integrally form a bottom portion of the first common vertical interconnect structure 793 (also referred to as a second horizontal contact structure) that is connected to the first pad structure 731 and the second pad structure 732. As a result, the second common vertical interconnect structure 790 can function as a common bottom S/D contact that is connected to bottom S/D regions (not shown) of the transistors 710 and 720 via the pad structures 731 and 732.

Figure 7D:
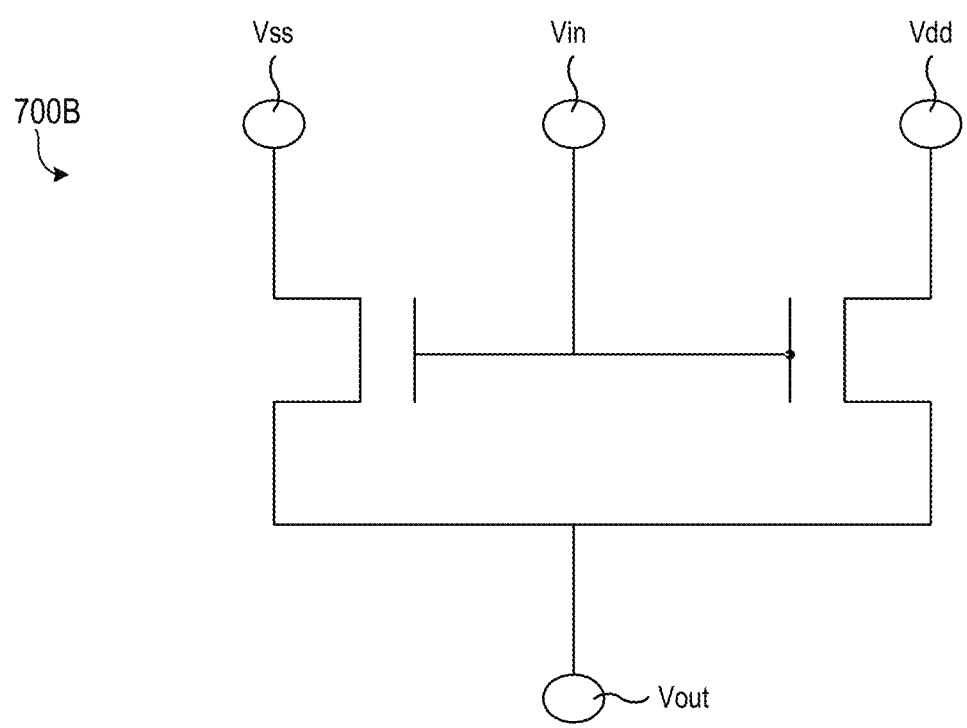
FIG. 7D is an equivalent circuit diagram of the semiconductor device in FIGS. 7A, 7B, and 7C, in accordance with exemplary embodiments of the disclosure.

FIG. 7D is an equivalent circuit diagram 700B of the semiconductor device 700A in FIGS. 7A-7C, in an embodiment where the transistors 710 and 720 form a CMOS device. The circuit diagram 700B shows that the semiconductor device 700A can function as a CMOS inverter that includes a ground voltage Vss, a supply voltage Vdd, an input voltage Vin, and an output voltage Vout. The ground voltage Vs and the supply voltage Vdd can correspond to the first vertical interconnect structures 750a and 750b. The input voltage Vin and the output voltage Vout can correspond to the first common vertical interconnect structure 780 and the second common vertical interconnect structure 790, respectively.

FIGS. 8A-8H are cross-sectional views of a semiconductor device 800, at various intermediate steps of manufacturing, in accordance with exemplary embodiments of the disclosure. Particularly, FIGS. 8A-8H can illustrate an example process for manufacturing a CMOS GAA inverter. As can be appreciated, other logic device types can also be created with techniques herein.

Figure 8A:
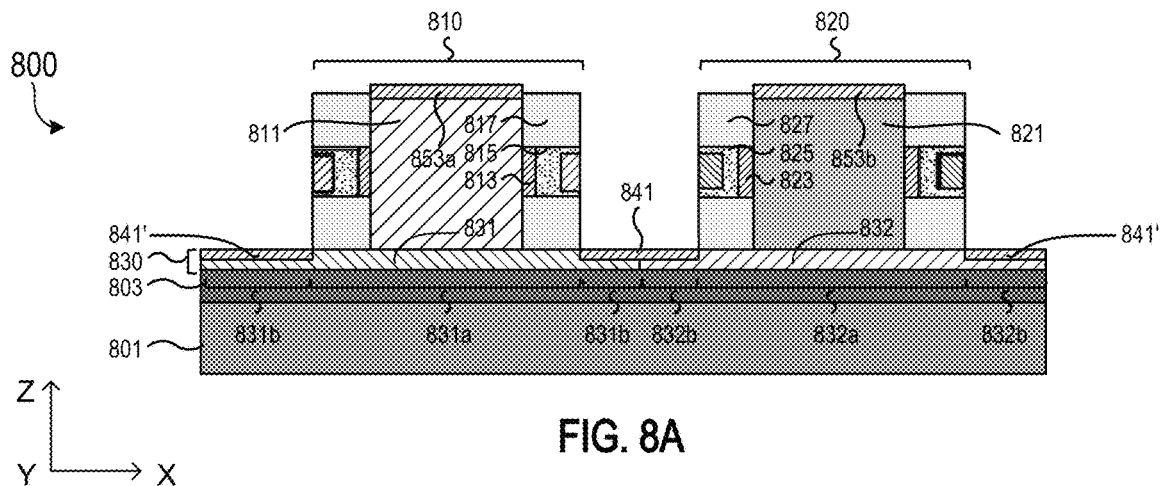
FIGS. 8A, 8B, 8C, 8D, 8E, 8F, 8G, and 8H are cross-sectional views of a semiconductor device, at various intermediate steps of manufacturing, in accordance with exemplary embodiments of the disclosure.

The semiconductor device 800 in FIG. 8A is similar to the semiconductor device 500 in FIG. 5A, except that a first pad structure 831 and a second pad structure 832 are in contact with each other. A first horizontal contact structure 841 and a second horizontal contact structure (not shown) and can be disposed that contacts both the first pad structure 831 and the second pad structure 832. Bottom portions of first vertical interconnect structures 853a and 853b can be disposed over a first channel structure 811 and a second channel structure 812. The first horizontal contact structure 841 can reduce resistance between the first pad structure 831 and the second pad structure 832. The first horizontal contact structure 841 can be arranged in recesses of the first pad structure 831 and the second pad structure 832 as shown in this example or over the first pad structure 831 and the second pad structure 832 in other embodiments. In this example, the bottom portions of first vertical interconnect structures 853a and 853b and the first horizontal contact structure 841 are made of one or more salicides, such as nickel silicde and nickel germanide, and horizontal structures 841' that are also made of a salicide can be disposed over peripheral areas 831b and 832b.

Figure 8B:
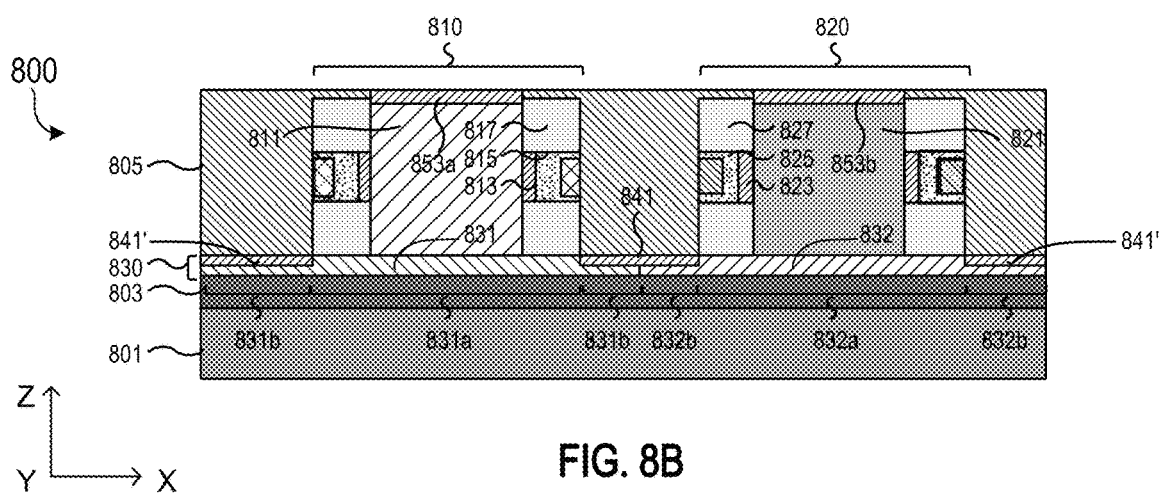
Figure 8C:
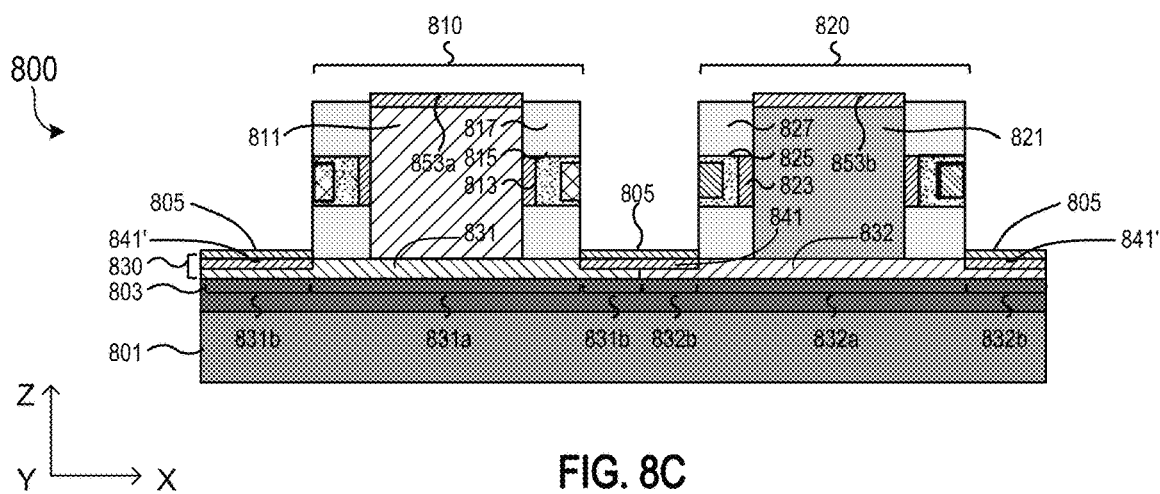
Figure 8D:
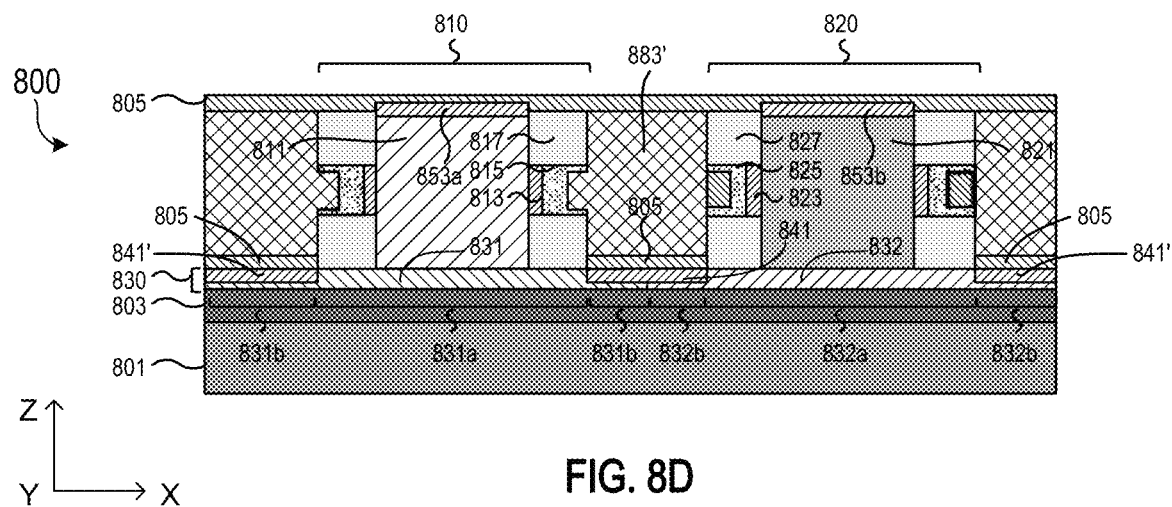

In FIG. 8B, a second dielectric 805 can be disposed over the first horizontal contact structure 841 and the horizontal structures 841'. In FIG. 8C, the second dielectric 805 can be etched to a predetermined thickness. In FIG. 8D, a first conductive material 883' (e.g., tungsten) can be deposited over the second dielectric 805, followed by planarization and deposition of the second dielectric 805.

Figure 8E:
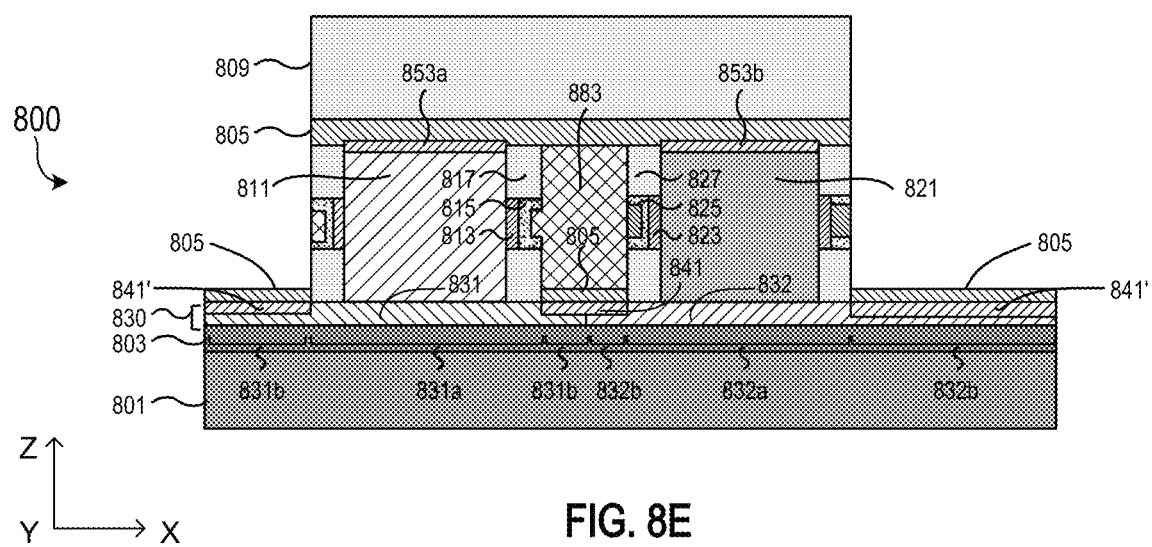

In FIG. 8E, a mask 809 is formed that defines future gate metal connections. A portion of the second dielectric 805 and a portion of the first conductive material 883' are removed. The remaining first conductive material 883' can form a bottom portion of a third vertical interconnect structure 883 that contacts a first gate structure 815 of a first transistor 810 and a second gate structure of a second transistor 820. In this example, the first transistor 810 and the second transistor 820 are NMOS and PMOS, respectively. Therefore, the bottom portion of the third vertical interconnect structure 883 is connected between NMOS and PMOS.

Figure 8F:
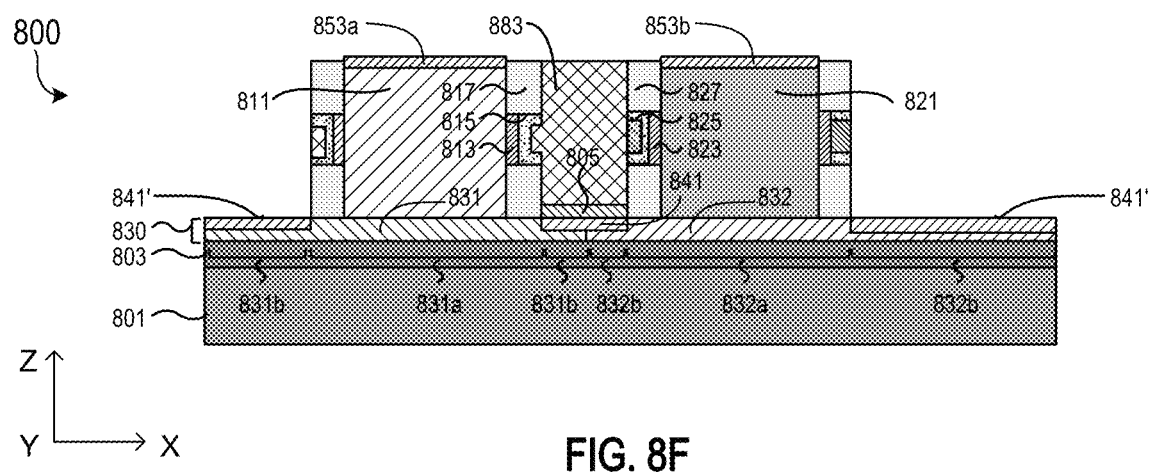

In FIG. 8F, the mask 809 and uncovered portions of the second dielectric 805 are removed so that the bottom portions of first vertical interconnect structures 853a and 853b are uncovered.

Figure 8G:
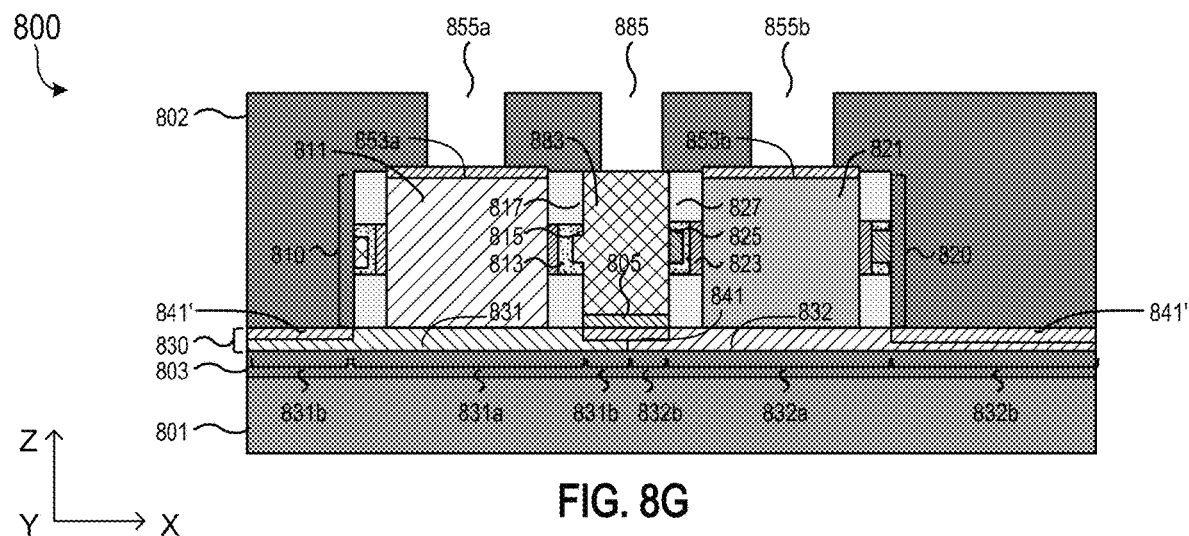

In FIG. 8G, an insulating material 802 (e.g., silicon oxide) is deposited to fill spaces and cover the first transistor 810 and the second transistor 820. Subsequently, openings (e.g., 855a, 855b, and 885a) can be defined and etched for contacts for inverter hookup. Note that at least four contacts are needed while FIG. 8G shows three openings 855a, 855b, and 885a. The fourth opening can be behind this cross sectional view of FIG. 8G.

Figure 8H:
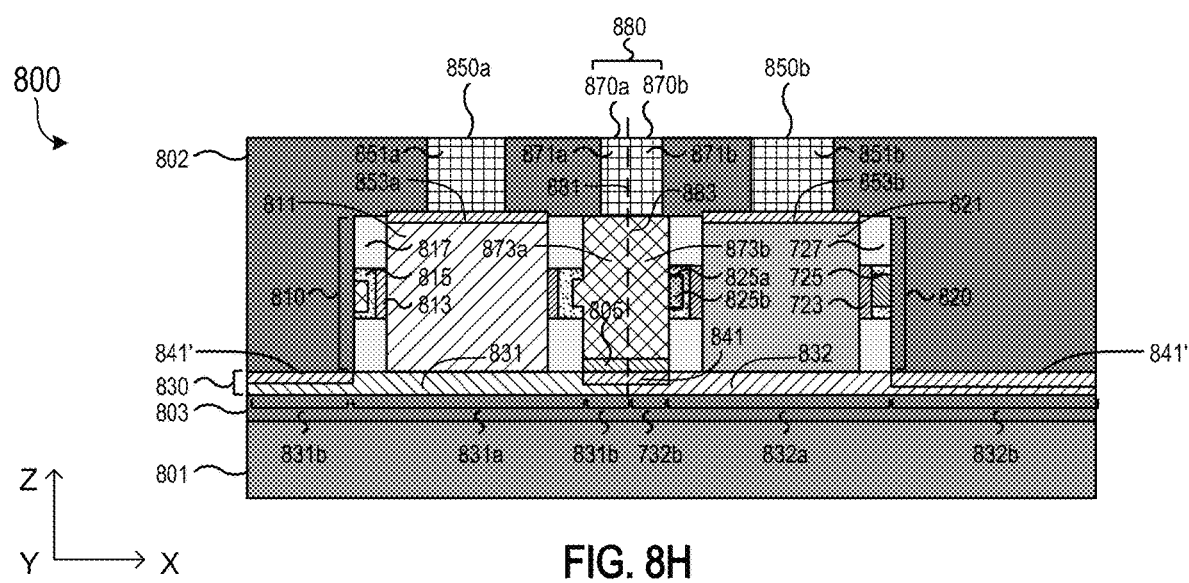

In FIG. 8H, a second conductive material can be deposited and any overburden can be removed by planarization. As a result, the first vertical interconnect structures 850a and 850b and the first common vertical interconnect structure 880 are completed. The semiconductor device 800 can correspond to the semiconductor device 700A in FIGS. 7A-7C. Accordingly, a second common vertical interconnect structure can be disposed behind the cross sectional view of FIG. 8H.

The various embodiments described herein offer several advantages. For example, vertical 3D epitaxial growth for vertical transistors allows current flow in a vertical dimension or perpendicular to wafer surface. Such methods and designs herein include making CMOS devices with upright current flow, that is, current flow in a direction. Vertical 3D devices herein enable another degree of freedom in the Z direction that will augment existing 3D devices for layout options. Having relatively short transistor lengths is achieved because channel length is defined by a deposited layer or epitaxially grown layer. Precise alignment with gate electrodes is achieved by selective removal of intermediate dielectric layers. Techniques herein eliminate the need for oxide isolation of a 3D nano stack. Vertical transistors can have unlimited width with gate-all-around (GAA) devices with particular substrate conditions.

Because the gate electrode and source regions have 360 degree access, a contact may be placed at any side of the source or any side of the gate. The source and drain may be interchanged because each channel can be isolated from other channels. 360 degree access is a significant benefit with the device architecture for maximum layout connections and routing. Given channel regions can be centered on the pad structures or offset for maximum layout efficiency depending on circuit requirements. Vertical 3D structures provide access (360 degree contact and routing access to channel, source and drain) thereby increasing circuit density. Several example embodiments of contact layouts with metal routing will be described and illustrated, including an inverter flow with GAA channels with 3D connections.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of microfabrication, the method comprising:
   forming a pad layer over a substrate, the pad layer including at least one pad structure having a core area surrounded by a peripheral area;
   forming a transistor over the core area of the pad structure, the transistor including a channel structure extending in a vertical direction and a gate structure all around a sidewall portion of the channel structure, the channel structure having a vertical channel region and a source region and a drain region on opposing ends of the vertical channel region, the channel structure being configured to be electrically coupled to the pad structure;
   forming a first vertical interconnect structure that contacts a top surface of the channel structure;
   forming a second vertical interconnect structure that contacts the peripheral area of the pad structure and is configured to be coupled to a bottom surface of the channel structure via the pad structure; and
   forming a third vertical interconnect structure that is positioned away from the channel structure and contacts the gate structure of the transistor.

2. The method of claim 1, wherein, after forming the transistor over the core area of the pad structure, the method further comprises:
   depositing an insulating material over the pad layer to fill spaces and cover the transistor.

3. The method of claim 2, wherein forming the first vertical interconnect structure comprises:
   forming an opening in the insulating material, the opening uncovering the top surface of the channel structure; and
   filling the opening with a conductive material.

4. The method of claim 2, wherein forming the second vertical interconnect structure comprises:
   forming an opening in the insulating material, the opening uncovering the peripheral area of the pad structure; and
   filling the opening with a conductive material.

5. The method of claim 2, wherein forming the third vertical interconnect structure comprises:
   forming an opening in the insulating material, the opening uncovering the gate structure; and
   filling the opening with a conductive material.

6. The method of claim 2, wherein prior to depositing the insulating material over the pad layer, the method further comprises:
   depositing a first conductive material that surrounds the transistor and contacts the gate structure; and
   etching, based on a mask, the first conductive material so that the first conductive material covers a sidewall portion of the transistor and contacts a sidewall portion of the gate structure.

7. The method of claim 6, wherein forming the third vertical interconnect structure further comprises:
   forming an opening in the insulating material, the opening uncovering the first conductive material; and
   filling the opening with a second conductive material, the second conductive material being disposed over the first conductive material.

8. The method of claim 1, further comprising forming a fourth vertical interconnect structure that contacts the peripheral area of the pad structure or the gate structure of the transistor.

9. A method of microfabrication, the method comprising:
   forming a pad layer over a substrate, the pad layer including a first pad structure and a second pad structure that is adjacent to and in contact with the first pad structure;
   forming transistors over the first and second pad structures, the transistors including a channel structure extending in a vertical direction and a gate structure all around a sidewall portion of the channel structure, the channel structure having a vertical channel region and a source region and a drain region on opposing ends of the vertical channel region, the channel structure being configured to be electrically coupled to a corresponding pad structure that is arranged below the channel structure and extends horizontally beyond a perimeter of the channel structure;
   forming a first vertical interconnect structure that contacts a first top surface of a first channel structure of a first transistor disposed over the first pad structure;
   forming a second vertical interconnect structure that contacts a second top surface of a second channel structure of a second transistor disposed over the second pad structure;
   forming a first common vertical interconnect structure that is configured to be coupled to a first gate structure of the first transistor and a second gate structure of the second transistor; and
   forming a second common vertical interconnect structure that contacts the first pad structure and the second pad structure.

10. The method of claim 9, wherein, after forming the transistors over the first and second pad structures, the method further comprises:
   forming a first horizontal contact structure and a second horizontal contact structure, both the first horizontal contact structure and the second horizontal contact structure contacting the first pad structure and the second pad structure;
   depositing a dielectric over the first horizontal contact structure;
   depositing a first conductive material over the dielectric to connect the first gate structure and the second gate structure; and
   depositing an insulating material over the pad layer to fill spaces and cover the transistors.

11. The method of claim 10, wherein:
forming the first vertical interconnect structure is accomplished by forming a first opening in the insulating material and filling the first opening with a second conductive material, the first opening uncovering the first top surface of the first channel structure,
forming the second vertical interconnect structure is accomplished by forming a second opening in the insulating material and filling the second opening with a third conductive material, the second opening uncovering the second top surface of the second channel structure,
forming the first common vertical interconnect structure is accomplished by forming a third opening in the insulating material and filling the third opening with a fourth conductive material, the third opening uncovering the first conductive material, and
forming the second common vertical interconnect structure is accomplished by forming a fourth opening in the insulating material and filling the fourth opening with a fifth conductive material, the fourth opening uncovering the second horizontal contact structure.

12. A semiconductor device, comprising:
a pad layer including at least one pad structure having a core area and a peripheral area that surrounds the core area;
a transistor over the core area of the pad structure, the transistor including a channel structure extending in a vertical direction and a gate structure all around a sidewall portion of the channel structure, the channel structure having a vertical channel region and a source region and a drain region on opposing ends of the vertical channel region, the channel structure being configured to be electrically coupled to the pad structure;
a first vertical interconnect structure that contacts a top surface of the channel structure;
a second vertical interconnect structure that contacts the peripheral area and is configured to be coupled to a bottom surface of the channel structure via the pad structure; and
a third vertical interconnect structure that is positioned away from the channel structure and contacts the gate structure of the transistor.

13. The semiconductor device of claim 12, further comprising a fourth vertical interconnect structure that contacts the peripheral area of the pad structure or the gate structure of the transistor.

14. The semiconductor device of claim 12, wherein the channel structure is positioned in a center of the pad structure or offset from the center of the pad structure.

15. The semiconductor device of claim 12, wherein:
the second vertical interconnect structure and the third vertical interconnect structure are positioned at a same radial location or different radial locations from the channel structure, and
the second vertical interconnect structure and the third vertical interconnect structure are positioned at a same distance or different distances from the channel structure.

16. The semiconductor device of claim 12, wherein one or more of the at least one pad structure are separated from each other by a dielectric.

17. The semiconductor device of claim 12, wherein:
the at least one pad structure includes a first pad structure and a second pad structure that is adjacent to and in contact with the first pad structure,
the third vertical interconnect structure over the first pad structure and the third vertical interconnect structure over the second pad structure are chemically identical and in contact with each other to integrally form a first common vertical interconnect structure, and
the second vertical interconnect structure over the first pad structure and the second vertical interconnect structure over the second pad structure are chemically identical and in contact with each other to integrally form a second common vertical interconnect structure.

18. The semiconductor device of claim 17, wherein:
the first common vertical interconnect structure contacts a first gate structure of a first transistor disposed over the first pad structure and a second gate structure of a second transistor disposed over the second pad structure, and
the second common vertical interconnect structure contacts the first pad structure and the second pad structure.

19. The semiconductor device of claim 18, further comprising:
a horizontal contact structure that contacts the first pad structure and the second pad structure, the horizontal contact structure being arranged below the first common vertical interconnect structure; and
a dielectric that separates the horizontal contact structure from the first common vertical interconnect structure.

* * * * *